(12) United States Patent
Nowshadi et al.

(10) Patent No.: US 11,418,198 B2
(45) Date of Patent: Aug. 16, 2022

(54) DIGITAL CLOCK GENERATION AND VARIATION CONTROL CIRCUITRY

(71) Applicant: QUALCOMM Incorporated, San Diego, CA (US)

(72) Inventors: Farshid Nowshadi, Harston (GB); John Bruce, Bishops Stortford (GB)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/005,752

(22) Filed: Aug. 28, 2020

(65) Prior Publication Data

US 2020/0395945 A1 Dec. 17, 2020

Related U.S. Application Data

(62) Division of application No. 15/410,574, filed on Jan. 19, 2017, now abandoned.

(51) Int. Cl.
| | | |
|---|---|---|
| H03K 5/133 | (2014.01) | |
| G06F 1/08 | (2006.01) | |
| H03L 7/08 | (2006.01) | |
| G06F 1/10 | (2006.01) | |
| H03K 5/00 | (2006.01) | |

(52) U.S. Cl.
CPC .............. *H03L 7/08* (2013.01); *G06F 1/08* (2013.01); *G06F 1/10* (2013.01); *H03K 5/00006* (2013.01); *H03K 5/133* (2013.01); *H03K 2005/00019* (2013.01)

(58) Field of Classification Search
CPC ....... H03L 7/08; H03L 7/0802; H03L 7/0805; H03L 7/0807; G06F 1/10; G06F 1/105; H03K 5/00006; H03K 5/133; H03K 5/134; H03K 2005/00019
See application file for complete search history.

(56) References Cited

U.S. PATENT DOCUMENTS

| | | | |
|---|---|---|---|
| 4,755,704 A | 7/1988 | Flora et al. | |
| 5,790,611 A | 8/1998 | Huang et al. | |
| 6,137,325 A * | 10/2000 | Miller, Jr. ............. | H03L 7/0805 327/156 |
| 6,150,863 A | 11/2000 | Conn et al. | |

(Continued)

FOREIGN PATENT DOCUMENTS

GB 2348327 A 9/2000

OTHER PUBLICATIONS

International Search Report and Written Opinion—PCT/US2017/063479—ISA/EPO—dated Apr. 18, 2018.

(Continued)

*Primary Examiner* — Patrick C Chen
(74) *Attorney, Agent, or Firm* — Colby Nipper/Qualcomm

(57) ABSTRACT

In certain aspects, a digital circuit comprises a delay line to generate a plurality of delayed versions of an input clock. The digital circuit also comprises selection circuitry to provide a selected one of the plurality of delayed versions of the input clock based on a clock selection signal and feedback circuitry to generate the clock selection signal based on the selected one of the plurality of delayed versions of the input clock and based on the input clock. The clock selection signal is further used for selecting and generating other clocks and/or for variation control.

28 Claims, 24 Drawing Sheets

(56) References Cited

U.S. PATENT DOCUMENTS

| | | |
|---|---|---|
| 6,259,283 B1 | 7/2001 | Nguyen |
| 6,320,436 B1 | 11/2001 | Fawcett et al. |
| 6,535,989 B1 | 3/2003 | Dvorak et al. |
| 6,753,709 B2 | 6/2004 | El-Kik |
| 6,759,885 B2 | 7/2004 | Chen |
| 6,819,157 B2 | 11/2004 | Cao et al. |
| 7,138,841 B1 | 11/2006 | Li et al. |
| 7,224,199 B1 * | 5/2007 | Kang .................. H03K 5/131 327/175 |
| 7,265,594 B2 | 9/2007 | Nakamura et al. |
| 2007/0047687 A1 | 3/2007 | Hsu et al. |
| 2009/0039867 A1 * | 2/2009 | Saint-Laurent .......... H03L 7/00 324/102 |
| 2010/0201416 A1 | 8/2010 | Lin et al. |
| 2012/0154000 A1 | 6/2012 | Tabata |
| 2013/0063181 A1 | 3/2013 | Chou et al. |
| 2016/0344237 A1 | 11/2016 | Cho |
| 2018/0205383 A1 | 7/2018 | Nowshadi et al. |

OTHER PUBLICATIONS

Partial International Search Report—PCT/US2017/063479—ISA/EPO—dated Feb. 7, 2018.

Si P., et al., "A Frequency Control Method for Regulating Wireless Power to Implantable Devices," IEEE transactions on biomedical circuits and systems, vol. 2, No. 1, pp. 22-29, Mar. 2008.

Si P., et al., "Stabilizing the Operating Frequency of a Resonant Converter for Wireless Power Transferto Implantable Biomedical Sensors", 1st International Conference on Sensing Technology, Nov. 23, 2005, pp. 477-482, XP055463852, Palmerston North, New Zealand, Retrieved from the Internet: https://pdfs.semanticscholar.org/55ef/488f623209e6ca6edf476eba89a695d692dd.pdf, Nov. 23, 2005, 6 pages.

\* cited by examiner

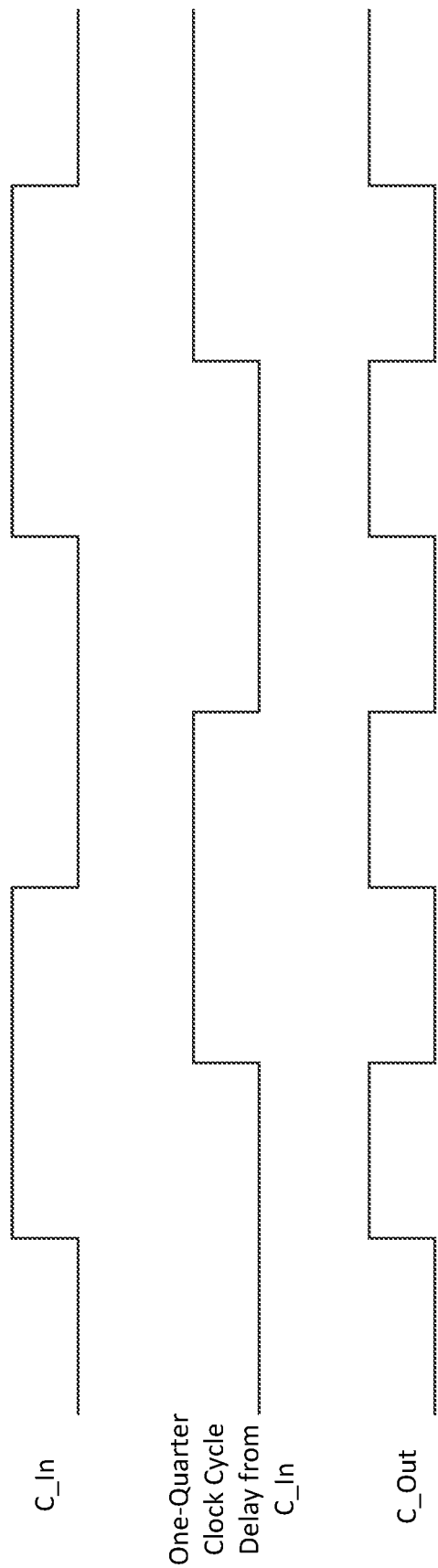

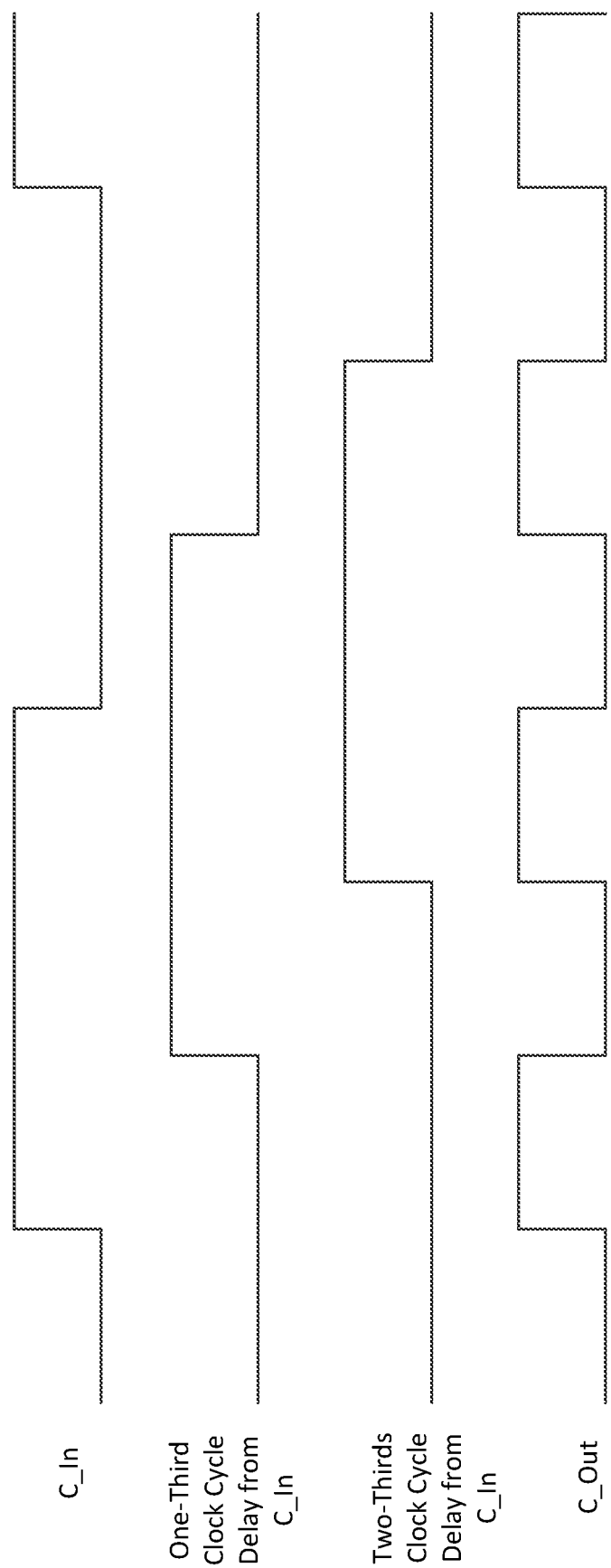

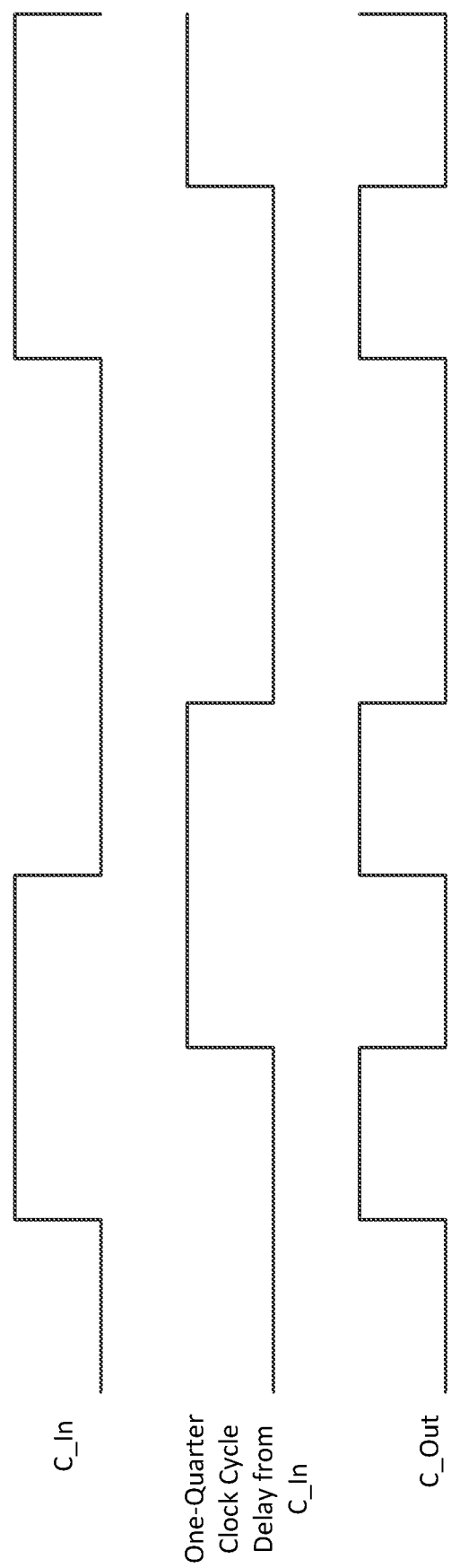

DIGITAL CLOCK GENERATION AND VARIATION CONTROL CIRCUITRY

CLAIM OF PRIORITY UNDER 35 U.S.C. § 119

The present application for patent claims priority to application Ser. No. 15/410,574 entitled "DIGITAL CLOCK GENERATION AND VARIATION CONTROL CIRCUITRY" filed Jan. 19, 2017, and assigned to the assignee hereof and hereby expressly incorporated by reference herein.

BACKGROUND

Field

Aspects of the present disclosure relate generally to clock generation and variation control.

Background

Modern integrated circuits contain millions of transistors integrated into a small semiconductor chip. The transistors typically operate synchronously using one or more clock signals. The frequencies of these clock signals range from a few megahertz to a few gigahertz. These high-frequency clock signals are usually generated using on-chip circuitry, using an accurate low-frequency off-chip clock signal as reference. One general technique to produce such high-frequency clock signals is using phase lock loop (PLL) circuitry. However, the PLLs are big in area and are power hungry. At the center of a PLL is a VCO that is difficult to design. Moreover, with the scaling of the size of the transistors and the supply voltage applied to the transistors, the variation increases, the voltage headroom for analog or RF design decreases, making an analog or RF design more challenging than ever. There is a preference to generate such a clock using a digital design technique.

An example digital design to produce a high-frequency clock is the use of a delay line plus an XOR gate. FIG. 1 illustrates an example digital circuit 100 implementing such a design. An input clock C_In couples to one input 101 of an exclusive or (XOR) gate. The input clock also feeds into a delay line to produce a delayed input clock. The delayed input clock couples to another input 102 of the XOR gate. The XOR gate produces an output clock at 103 having a frequency double that of the input clock. Typically, the delay of the delay line depends on the manufacturing process used to build the delay line, supply voltage applied to the delay line, and the temperature the delay line experiences. The output clock generated through this design, therefore, may come with an undesirable, uncertain, and/or unpredictable duty cycle. There is a need to use a high-frequency clock circuit that is easy to design, less power hungry, and/or less vulnerable to process, voltage, and/or temperature variation.

SUMMARY

The following presents a simplified summary of one or more implementations to provide a basic understanding of such implementations. This summary is not an extensive overview of all contemplated implementations, and is intended to neither identify key or critical elements of all implementations nor delineate the scope of any or all implementations. Its sole purpose is to present some concepts of one or more implementations in a simplified form as a prelude to the more detailed description that is presented later.

In one aspect, a digital circuit comprises a first delay line configured to receive an input clock, wherein the first delay line comprises a plurality of first delay units. The plurality of first delay units are coupled in series. Each of the plurality of first delay units is configured to provide substantially a same first delay. The plurality of first delay units are configured to provide a plurality of delayed versions of the input clock with each of the plurality of first delay units being configured to provide respective one of the plurality of delayed versions of the input clock. The digital circuit further comprises first selection circuitry configured to receive a first set of the plurality of delayed versions of the input clock and to provide first selected one of the plurality of delayed versions of the input clock based on a clock selection signal. The digital circuit further comprises feedback circuitry configured to generate the clock selection signal based on the first selected one of the plurality of delayed versions of the input clock and based on the input clock.

In another aspect, a method for clock generation comprises receiving an input clock and generating a plurality of delayed versions of the input clock using a first delay line. The first delay line comprises a plurality of first delay units. The plurality of first delay units are coupled in series. Each of the plurality of first delay units is configured to provide substantially a same delay. The plurality of first delay units are configured to provide a plurality of delayed versions of the input clock with each of the plurality of first delay units being configured to provide respective one of the plurality of delayed versions of the input clock. The method further comprises selecting first selected one of the plurality of delayed versions of the input clock out of a first set of the plurality of delayed versions of the input clock based on a clock selection signal and generating the clock selection signal based on the selected one of the plurality of delayed versions of the input clock and based on the input clock.

To the accomplishment of the foregoing and related ends, the one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the described implementations are intended to include all such aspects and their equivalents.

BRIEF DESCRIPTION OF THE DRAWINGS

FIG. 9A shows exemplary waveforms for generating a high clock frequency according to certain aspects of the present disclosure.

FIG. 9B shows another exemplary waveforms for generating a high clock frequency according to certain aspects of the present disclosure.

FIG. 9C shows exemplary waveforms for generating a high clock frequency with an input clock that has an uneven duty cycle according to certain aspects of the present disclosure.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Feedback circuitry can compensate for process, voltage, and/or temperature variation of a delay line. The delay line comprises a series of substantially identical (designed to be the same but may have minor differences in implementation due to factors such as variation) delay units. Using a reference clock, the feedback circuitry tracks the process, voltage, and/or temperature variation and adjusts the number of the delay units used to delay a reference clock so the reference clock experiences a desired delay. The feedback circuitry may vary the number of the delay units used to delay the reference clock over time due to changes in voltage or temperature or both. Furthermore, the number of the delay units selected by the feedback circuitry on one chip may be different from the number selected by the feedback circuitry on another chip due to difference in manufacturing process experienced by the two different chips. One or more delayed clocks with accurate delays may be generated by selecting a desired number of delay units. Using one or more XOR gates, higher frequency clocks may be generated with desired duty cycles.

The number of the delay units needed to produce a desired delay on a particular chip is also an indication of the process, voltage, or temperature variation or combinations thereof of the particular chip. Therefore, the number of the delay units may be used to fine-tune the supply voltage or the operation clock frequency or both of the particular chip to mitigate the variation.

Figure 1:
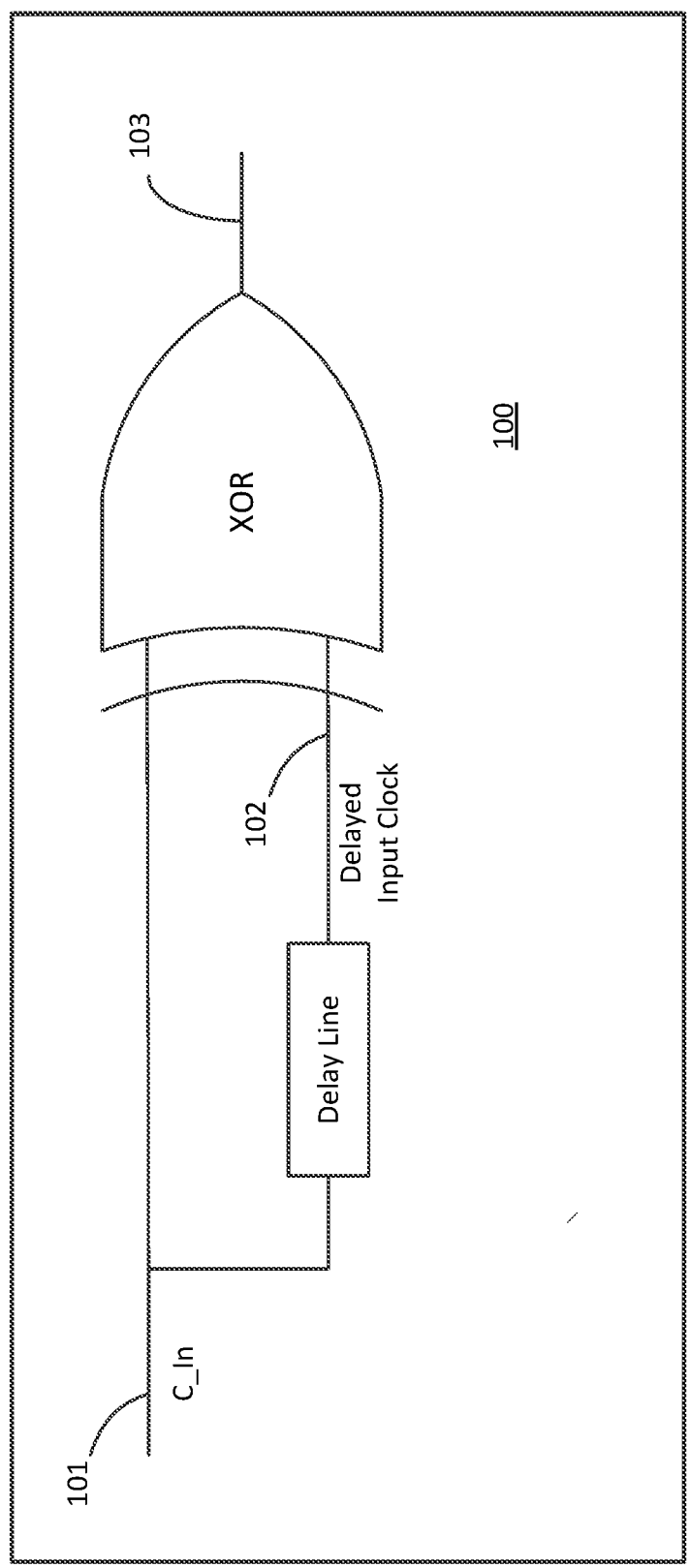
FIG. 1 shows an example of circuitry for doubling an input clock frequency using a delay line.
Figure 2:
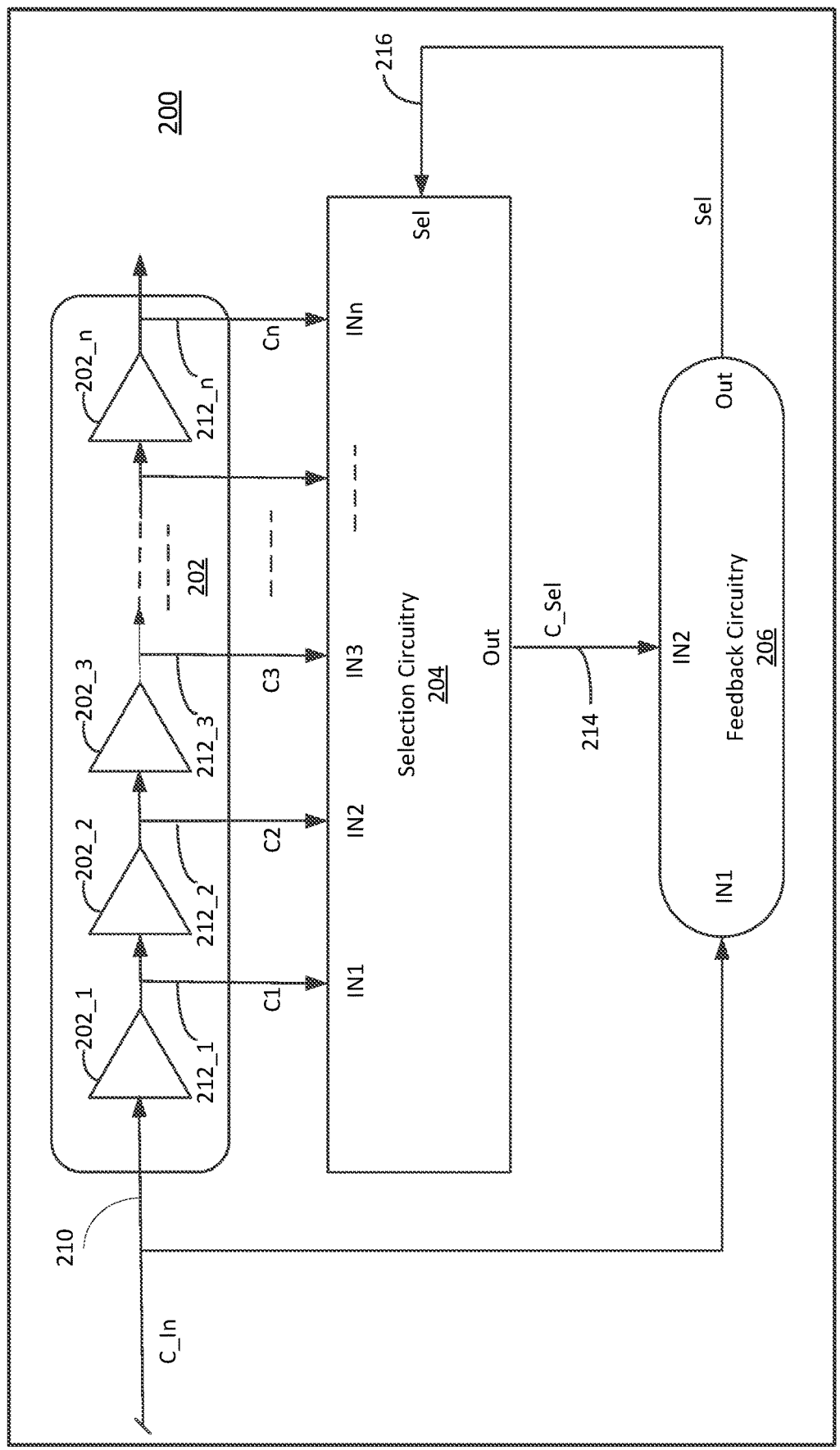
FIG. 2 shows an example of a delay line with feedback circuitry to generate a clock selection signal for selecting a desired delayed clock according to certain aspects of the present disclosure.

FIG. 2 shows a block diagram of an exemplary clock selection signal generator 200 using a delay line 202, selection circuitry 204, and feedback circuitry 206 to generate a clock selection signal Sel at 216. The delay line 202 comprises a plurality of delay units 202_1, 202_2, 202_3, . . . , 202_n, where n is an integer. The delay units 202_1, 202_2, 202_3, . . . , 202_n are usually identical to each other in design. Therefore, each delay unit 202_1, 202_2, 202_3, . . . , 202_n has a substantially same base delay, Td. In implementation, the actual delay of each delay unit may vary somewhat due to physical differences resulting from manufacturing process variation, differences in the temperature experienced by each delay unit, and/or differences in the voltage provided to each delay unit. Delay units 202_1, 202_2, 202_3, . . . , 202_n can be positioned in close proximity to one another to minimize the variation. Alternatively, the delay units may not be identical in design but with a substantially same delay for some or all delay units.

One example embodiment of the delay units 202_1, 202_2, 202_3, . . . , 202_n uses buffers. Each buffer may be formed using two inverters coupled in series. Alternatively, the buffers may be formed by NAND gates, NOR gates, or other logic gates. Alternatively, each of the delay units 202_1, 202_2, 202_3, . . . , 202_n may be implemented with other logic gates, such as inverters, NAND gates, NOR gates, and the like. In another embodiment, the delay units 202_1, 202_2, 202_3, . . . , 202_n may be implemented using analog delay components, such as RC delay circuits.

The delay units 202_1, 202_2, 202_3, . . . , 202_n are coupled in series, with the output of the previous delay unit feeding into the input of the next delay unit. For example, the output of the delay unit 202_2 couples to the input of the delay unit 202_3. The input of the first delay unit 202_1, however, couples to an input clock C_In at terminal 210. The input clock C_In is a reference clock. One example of such an input clock may be from an off-chip crystal oscillator. The crystal oscillator is generally stable across voltage and temperature range, making it an ideal reference clock generator. Other sources of highly accurate clocks may be used as reference clocks as well.

The delay line 202 receives the input clock C_In. The plurality of delay units 202_1, 202_2, 202_3, . . . , 202_n of the delay line 202 are configured to provide a plurality of delayed versions of the input clock C1, C2, C3, . . . , Cn at terminals 212_1, 212_2, 212_3, . . . , 212_n, respectively. Each of the plurality of delay units 202_1, 202_2, 202_3, . . . , 202_n is configured to provide a respective one of the plurality of delayed versions of the input clock C1, C2, C3, . . . , Cn. For example, the delay unit 202_1 generates the delayed version of the input cock C1, the delay unit 202_2 generates the delayed version of the input clock C2, and the delay unit 202_n generates the delayed version of the input clock Cn. Each of the plurality of delayed versions of the input clock C1, C2, C3, . . . , Cn is a reproduction of the input clock C_In with a respective delay. Each of the plurality of delayed versions of the input clock C1, C2, C3, . . . , Cn is delayed by a respective integer multiple of Td from the input clock C_In. For example, the delayed version of the input clock C1 is delayed from the input clock C_In by Td, the delayed version of the input clock C2 is delayed from the input clock C_In by 2Td, and the delayed version of the input clock Cn is delayed from the input clock C_In by nTd. As noted previously, Td for each delay unit may be slightly different due to the variation from one or a combination of process, voltage, and temperature difference but should be close enough and substantially the same, as their designs are usually identical.

Each of the delayed versions of the input clock C1, C2, C3, . . . , Cn is offset in time from the input clock C_In by a fraction (e.g., one-quarter, one-third, one-half, two-thirds) of one clock period of the input clock C_In. The value of the fraction can be less than 1. Alternatively, some of the delayed versions of the input clock C1, C2, C3, . . . , Cn may be offset in time from the input clock C_In by a whole number (e.g., one) clock period(s) of the input clock C_In.

Selection circuitry 204 receives a set of the plurality of delayed versions of the input clocks C1, C2, C3, . . . , Cn. The set of the plurality of delayed versions of the input clock may be all of the plurality of delayed versions of the input clock C1, C2, C3, . . . , Cn or a subset of the plurality of delayed versions of the input clock C1, C2, C3, . . . , Cn. The subset may be arbitrarily picked from the plurality of delayed versions of the input clock C1, C2, C3, . . . , Cn. The following illustration uses an example where the selection circuitry 204 receives all of the plurality of delayed versions of the input clock C1, C2, C3, . . . , Cn. The same concept applies to a configuration where fewer than all of the plurality of delayed versions of the input clock C1, C2, C3, . . . , Cn are fed into the selection circuitry 204.

The selection circuitry 204 selects one of the plurality of delayed versions of the input clock C1, C2, C3, . . . , Cn by a clock selection signal Sel and provides the selected one of the plurality of delayed versions of the input clock C_Sel at terminal 214. One exemplary implementation of the selection circuitry 204 is a multiplexer. The multiplexer has multiple inputs IN1, IN2, IN3, . . . , INn and an output, in which each input is coupled to a respective one of the plurality of delayed versions of the input clock C1, C2, C3, . . . , Cn. The multiplexer is configured to selectively couple one of the plurality of delayed versions of the input clock C1, C2, C3, . . . , Cn to the output 214 based on the clock selection signal Sel.

The feedback circuitry 206 generates the clock selection signal Sel in response to the selected one of the plurality of delayed versions of the input clock C_Sel and the input clock C_In. The feedback circuitry 206 receives both the selected one of the plurality of delayed versions of the input clock C_Sel and the input clock C_In. The feedback circuitry 206 compares the two clocks. If the delay of the selected one of the plurality of the delayed versions of the input clock C_Sel with respect to the input clock C_In is too small as compared with a desired delay, the feedback circuitry 206 changes the value of the clock selection signal Sel. With the updated clock selection signal Sel, the selection circuitry 204 selects a different delayed version of the input clock with a larger delay. For example, if the current selection is C3, the next selection may be C4.

If the delay of the selected one of the plurality of the delayed versions of the input clock C_Sel is too large as compared with the desired delay, the feedback circuitry 206 changes the value of the clock selection signal Sel. The selection circuitry 204, in response to the updated clock selection signal Sel, selects a different delayed version of the input clock with a smaller delay. For example, if the current selection is C3, the next selection may be C2. This process continues until the feedback circuitry 206 finds the right value for the clock selection signal Sel. At this value of the clock selection signal Sel, the selection circuitry 204 selects one of the plurality of delayed versions of the input clock C1, C2, C3, . . . , Cn that has the desired delay from the input clock.

Exemplary implementations of the feedback circuitry 206 will now be discussed below with reference to FIGS. 3A-3D and FIGS. 4A-4B.

Figure 3A:
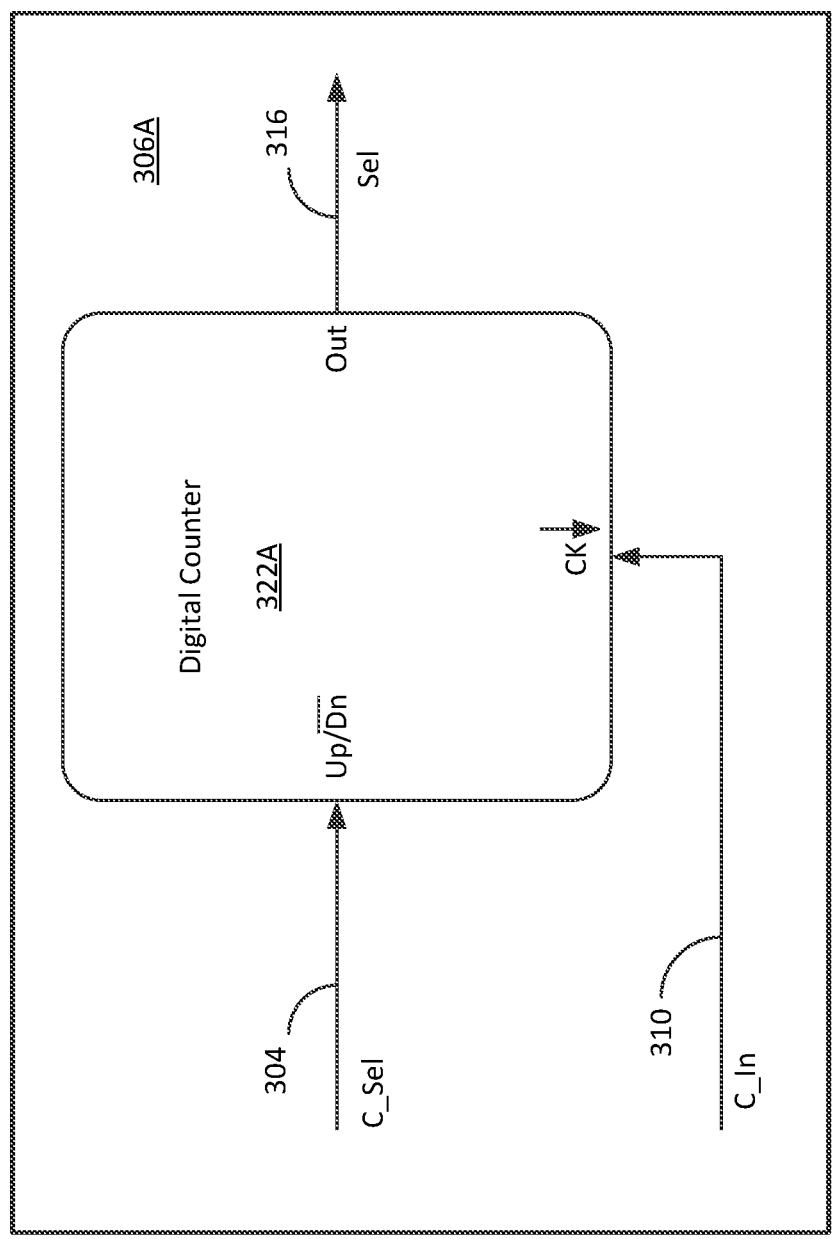
FIG. 3A shows an exemplary implementation of the feedback circuitry according to certain aspects of the present disclosure.

FIG. 3A shows an exemplary implementation 306A of a part or all of the feedback circuitry 206 configured to generate a clock selection signal Sel to select a delayed version of the input clock having a delay with respect to the input clock C_In that is one-half of the clock period of the input clock C_In. In this implementation, the feedback circuitry 206 comprises a digital counter 322A configured to generate the clock selection signal in response to the input clock and a count control signal. The digital counter 322A has a count control input 304 coupled to the count control signal and an output 316. The output 316 may be multi-bit data. The digital counter 322A receives a clock 310. The counting of the digital counter 322A is triggered by the falling edge of the clock 310 thereby changing a digital count data of the digital counter 322A. The count control input 304 receives the count control signal. The count control signal controls the direction of the counting. When the count control input 304 is a logic high at the falling edge of the clock 310, the digital counter 322A counts up and the value of the output 316 increases by 1 in response to the falling edge of the clock 310. When the count control input 304 is a logic low at the falling edge of the clock 310, the digital counter 322A counts down and the value of the output 316 decreases by 1 in response to the falling edge of the clock 310.

The selected one of the plurality of delayed versions of the input clock C_Sel functions as the count control signal and is coupled to the count control input 304, and the input clock C_In couples to the digital counter clock 310. The output of the digital counter 316 couples to the clock selection signal Sel. The selection circuitry 204 starts by selecting one of the plurality of delayed versions of the input clock C1, C2, C3, ..., Cn with a relatively small delay. For such a selection, at the falling edge of the input clock C_In, the selected one of the plurality of delayed versions of the input clock C_Sel is at logic high. The digital counter 322A counts up and increases the value of the output 316, which couples to the clock selection signal Sel. The new clock selection signal then selects the next delayed version of the input clock with a larger delay. This process continues until the selected one of the plurality of delayed versions of the input clock C_Sel is at logic low at the falling edge of the input clock C_In. At this time, the digital counter 322A counts down. The value of the output 316 decreases at the falling edge of the input clock C_In. The selection circuitry 204 then selects next delayed version of the input clock with a smaller delay. The selection circuitry 204, together with the feedback circuitry 206, eventually reach a quasi-stable state when the rising edge of the selected one of the plurality of delayed versions of the input clock C_Sel and the falling edge of the input clock C_In substantially align. Thus, the selected one of the plurality of delayed versions of the input clock C_Sel is about one-half of a clock period delayed from the input clock C_In. Please note, the selected one of the plurality of delayed versions of the input clock C_Sel might not be exactly one-half of a clock period delayed from the input clock C_In. The digital counter 322A continues counting up or down, bouncing back and forth around the desired value of the clock selection signal. The selected one of the plurality of delayed versions of the input clock C_Sel also bounces back and forth around one-half of the clock period delay from the input clock C_In. If the base delay for each delay unit, Td, is small enough, such variation may be insignificant and tolerable.

Figure 3B:
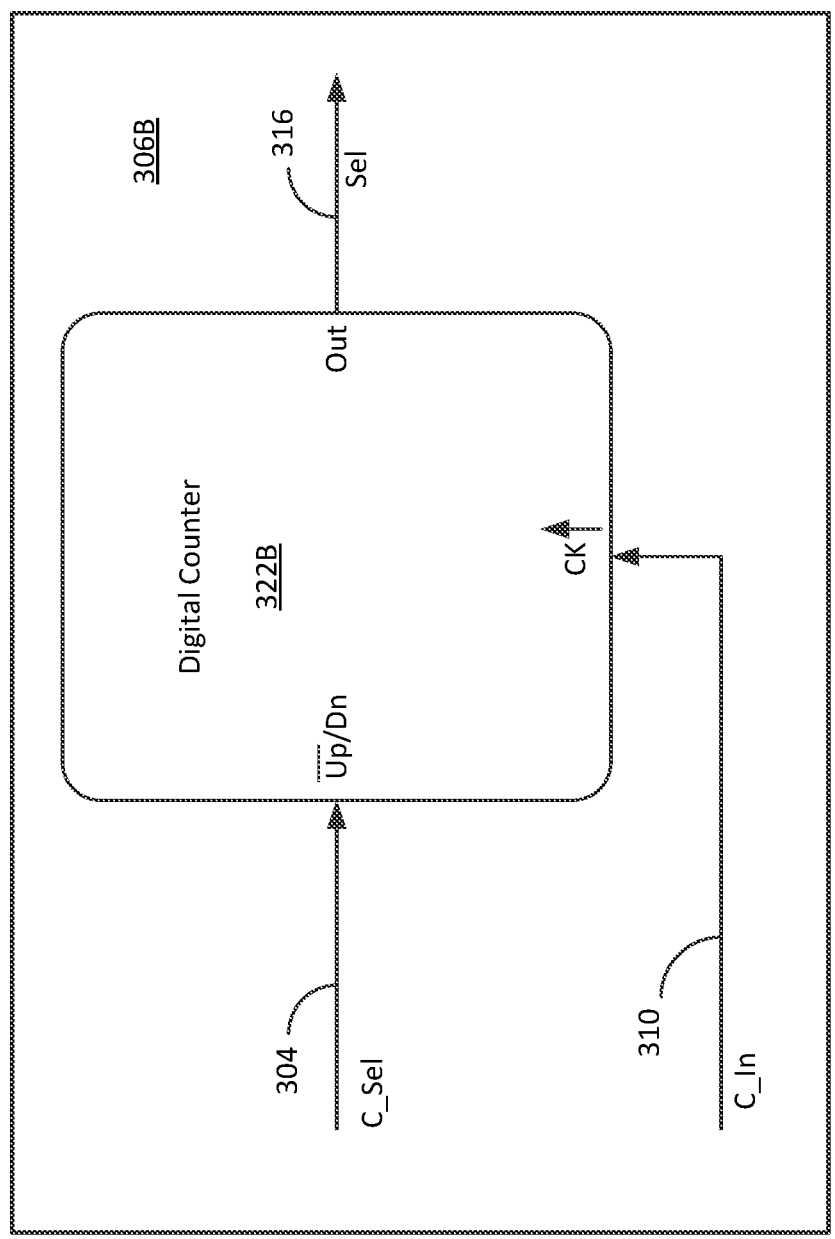
FIG. 3B shows another exemplary implementation of the feedback circuitry according to certain aspects of the present disclosure.

FIG. 3B shows another exemplary implementation 306B of a part or all of the feedback circuitry 206 for generating a clock selection signal to select a delayed version of the input clock having a delay with respect to the input clock C_In that is one-half of the clock period of the input clock. Like the feedback circuitry in FIG. 3A, the feedback circuitry in FIG. 3B comprises a digital counter configured to generate the clock selection signal in response to the input clock and a count control signal. The circuit configuration of FIG. 3B is similar to that of FIG. 3A. A digital counter 322B has a count control input 304 coupled to the count control signal, a clock input 310, and an output 316. The selected one of the plurality of delayed version of the input clock C_Sel functions as the count control signal and couples to the digital counter count control input 304. The input clock C_In couples to the digital counter clock input 310. The output of the digital counter 316 couples to the clock selection signal Sel.

Different from the digital counter 322A in FIG. 3A, the digital counter 322B in FIG. 3B is triggered by the rising edge of the input clock C_In thereby changing a digital count data of the digital counter 322B. The count control input 304 controls the direction of the counting. When the count control input 304 is a logic low at the rising edge of the input clock C_In, the digital counter 322B counts up and the value of the output 316 increases by 1 in response to the rising edge of the input clock C_In. When the count control input 304 is a logic high at the rising edge of the input clock C_In, the digital counter 322B counts down and the value of the output 316 decreases by 1 in response to the rising edge of the input clock C_In. In such a configuration, the selection circuitry 204, together with the feedback circuitry 206, eventually reach a quasi-stable state when the falling edge of the selected one of the plurality of delayed versions of the input clock C_Sel and the rising edge of the input clock C_In substantially align. As a result, the selected one of the plurality of delayed versions of the input clock C_Sel is about one-half of a clock period delayed from the input clock C_In. Similar to the configuration in FIG. 3A, the selected one of the plurality of delayed versions of the input clock C_Sel might not be exactly one-half of a clock period delayed from the input clock C_In. The clock selection signal Sel may bounce back and forth around the desired value. Nevertheless, if the base delay for each delay unit, Td, is small enough, such variation may be insignificant and tolerable.

Figure 3C:
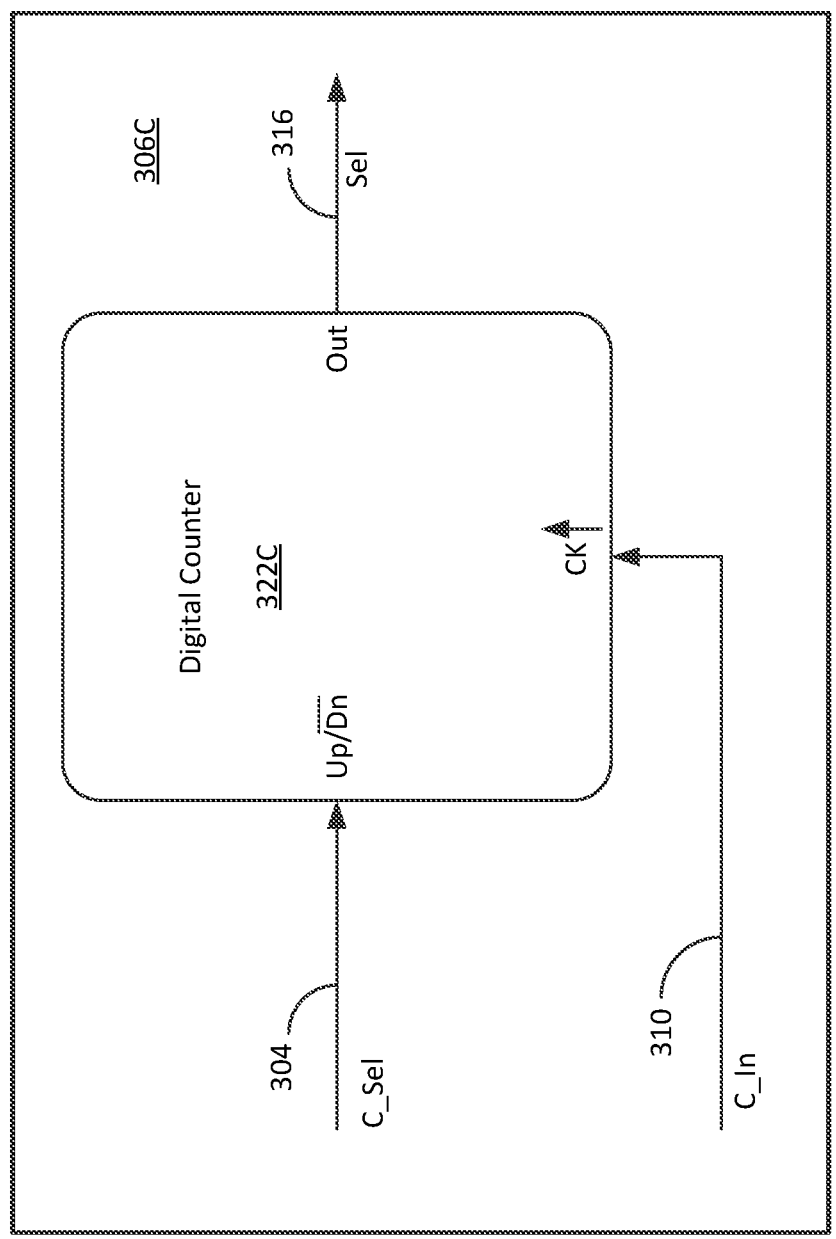
FIG. 3C shows still another exemplary implementation of the feedback circuitry according to certain aspects of the present disclosure.

FIG. 3C shows another exemplary implementation 306C of a part or all of the feedback circuitry 206 for generating a clock selection signal to select a delayed version of the input clock having a delay with respect to the input clock C_In that is one clock period of the input clock. Like the feedback circuitry in FIG. 3A, the feedback circuitry in FIG. 3C comprises a digital counter configured to generate the clock selection signal in response to the input clock and a count control signal. The circuit configuration of FIG. 3C is similar to that of FIG. 3A. A digital counter 322C has a count control input 304 coupled to the count control signal, a clock input 310, and an output 316. The input clock C_In couples to the digital counter clock input 310. The selected one of the plurality of delayed versions of the input clock C_Sel functions as the count control signal and couples to the count control input 304. The output of the digital counter 316 couples to the clock selection signal Sel.

Different from the digital counter in FIG. 3A, the digital counter 322C is triggered by the rising edge of the input clock C_In thereby changing a digital count data of the digital counter 322C. The count control input 304 controls the direction of the counting. When the count control input 304 is a logic high at the rising edge of the input clock C_In, the digital counter 322C counts up and the value of the output 316 increases by 1 in response to the rising edge of the input clock C_In. When the count control input 304 is a logic low at the rising edge of the input clock C_In, the digital counter 322C counts down and the value of the output 316 decreases by 1 in response to the rising edge of the input clock C_In. In such a configuration, the selection circuitry 204, together with the feedback circuitry 206, eventually reach a quasi-stable state when the rising edge of the selected one of the plurality of delayed versions of the input clock C_Sel and the rising edge of the input clock C_In substantially align. Thus, the selected one of the plurality of delayed versions of the input clock C_Sel is about one clock period delayed from the input clock C_In. Similar to the configuration in FIG. 3A, the selected one of the plurality of delayed versions of the input clock C_Sel might not be exactly one clock period delayed from the input clock C_In. The clock selection signal Sel bounces back and forth around the desired value. Nevertheless, if the base delay for each delay unit, Td, is small enough, such variation may be insignificant and tolerable.

Figure 3D:
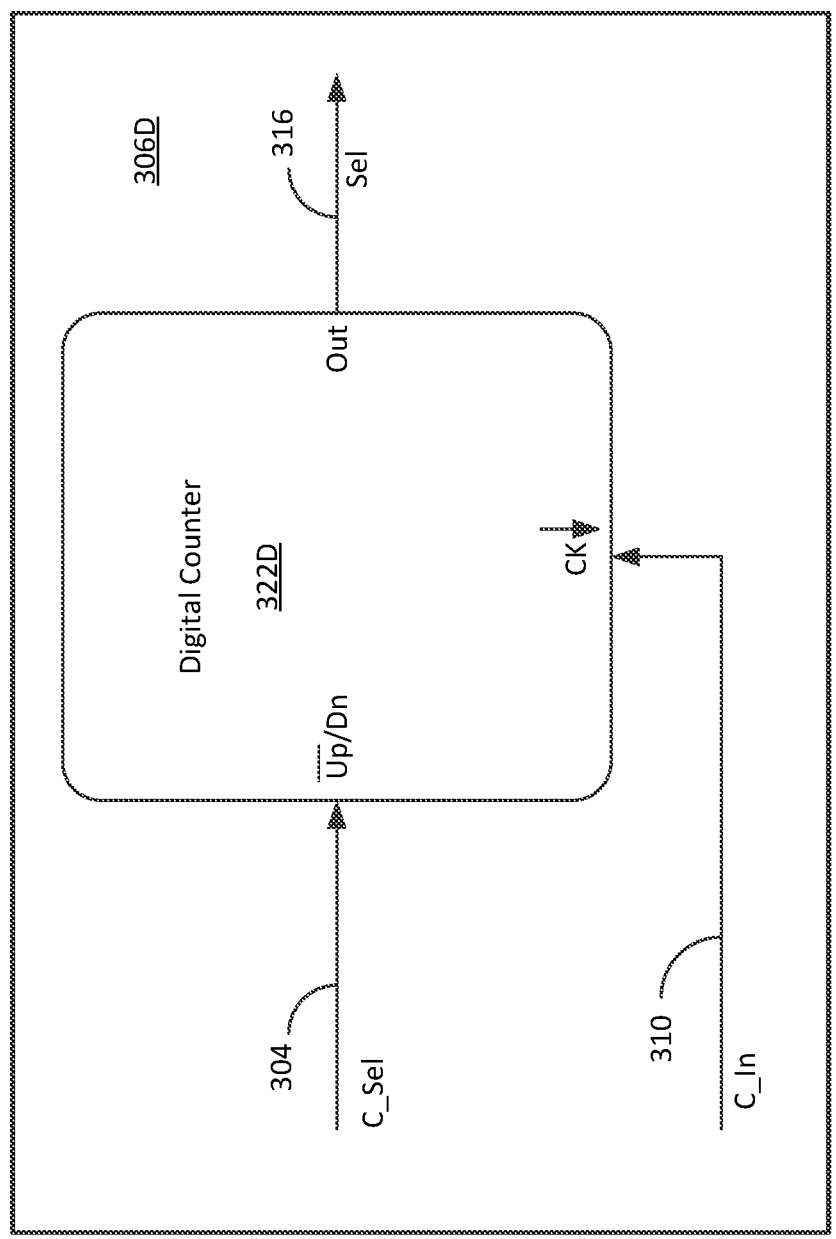
FIG. 3D shows still another exemplary implementation of the feedback circuitry according to certain aspects of the present disclosure.

FIG. 3D shows another exemplary implementation 306D of a part or all of the feedback circuitry 206 for generating a clock selection signal to select a delayed version of the input clock having a delay with respect to the input clock C_In that is one clock period of the input clock. Like the feedback circuitry in FIG. 3C, the feedback circuitry in FIG. 3D comprises a digital counter configured to generate the clock selection signal in response to the input clock and a count control signal. The circuit configuration of FIG. 3D is similar to that of FIG. 3C. A digital counter 322D has a count control input 304 coupled to the count control signal, a clock input 310, and an output 316. The input clock C_In couples to the digital counter clock input 310. The selected one of the plurality of delayed versions of the input clock C_Sel functions as the count control signal and couples to the count control input 304. The output of the digital counter 316 couples to the clock selection signal Sel.

Different from the digital counter in FIG. 3C, the digital counter 322D is triggered by the falling edge of the input clock C_In thereby changing a digital count data of the digital counter 322D. The count control input 304 controls the direction of the counting. When the count control input 304 is a logic low at the falling edge of the input clock C_In, the digital counter 322D counts up and the value of the output 316 increases by 1 in response to the falling edge of the input clock C_In. When the count control input 304 is a logic high at the falling edge of the input clock C_In, the digital counter 322D counts down and the value of the output 316 decreases by 1 in response to the falling edge of the input clock C_In. In such a configuration, the selection circuitry 204, together with the feedback circuitry 206, eventually reach a quasi-stable state when the falling edge of the selected one of the plurality of delayed versions of the input clock C_Sel and the falling edge of the input clock C_In substantially align. Thus, the selected one of the plurality of delayed versions of the input clock C_Sel is about one clock period delayed from the input clock C_In. Similar to the configuration in FIG. 3C, the selected one of the plurality of delayed version of the input clock C_Sel might not be exactly one clock period delayed from the input clock C_In. The clock selection signal Sel bounces back and forth around the desired value. Nevertheless, if the base delay for each delay unit, Td, is small enough, such variation may be insignificant and tolerable.

To minimize the number of iterations to reach the quasi-stable state and to ensure the selection circuitry 204 and the feedback circuitry 206 to lock at a desired delay, the circuitry in FIGS. 3A-3D may include an initialization circuit (not shown). The initialization circuit sets the value of the clock selection signal Sel when clock selection signal generator 200 starts. The initialization value of the clock selection signal Sel should be close to the final value at the quasi-stable state. One exemplary approach to select the initialization value of the clock selection signal Sel is to determine it by simulation at a nominal process corner, nominal voltage, and nominal temperature during circuit design.

Figure 4A:
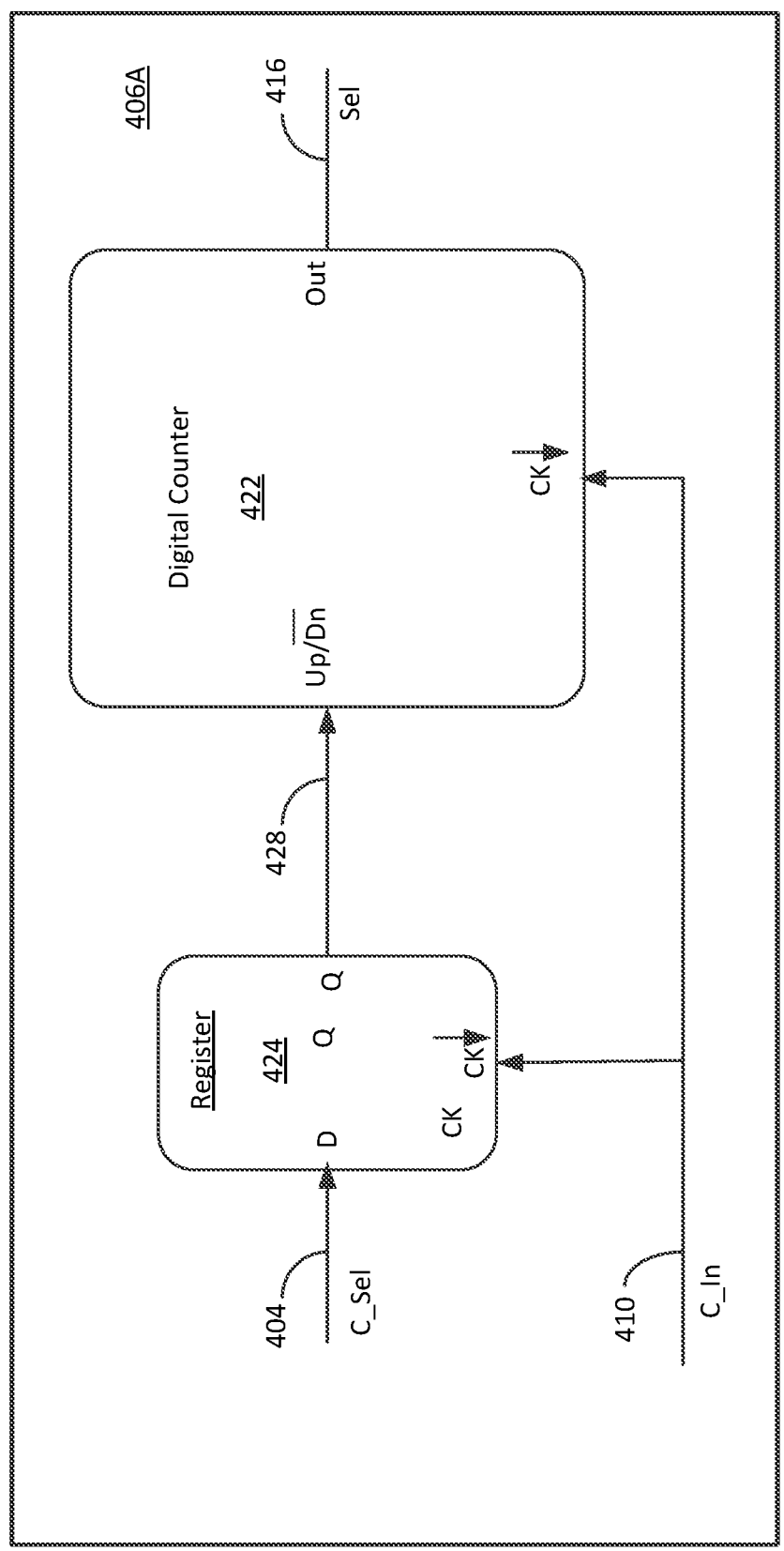
FIG. 4A shows still another exemplary implementation of the feedback circuitry according to certain aspects of the present disclosure.

FIG. 4A shows another exemplary implementation 406A of a part or all of the feedback circuitry 206 for generating a clock selection signal to select a delayed version of the input clock having a delay with respect to the input clock C_In that is one-half of a clock period of the input clock. The circuitry 406A has an input 404 coupled to the selected one of the plurality of delayed versions of the input clock C_Sel, an input 410 coupled to the input clock C_In, and an output 416 coupled to the clock selection signal Sel. The circuitry 406A is a variant from the configuration of FIG. 3A. The feedback circuitry 206 comprises a digital counter 422 that is the same as or similar to 322A. The feedback circuitry 206 further comprises a register 424 configured to provide the count control signal in response to the input clock and the first selected one of the plurality of delayed versions of the input clock. A register 424 is added in the path from the selected one of the plurality of delayed versions of the input clock C_Sel and the digital counter 422 count control input 428. The register 424 is clocked and triggered by the falling edge of the input clock C_In. In this configuration, the register 424 stores the value of the selected one of the plurality of delayed versions of the input clock C_Sel at the falling edge of the input clock C_In. By using the register 424, the count control input 428 is more stable during the falling edge of the input clock. The counting of the digital counter 422, therefore, is less vulnerable to the uncertainty or malfunction due to the uncertainty of the logic value of the count control input signal.

Figure 4B:
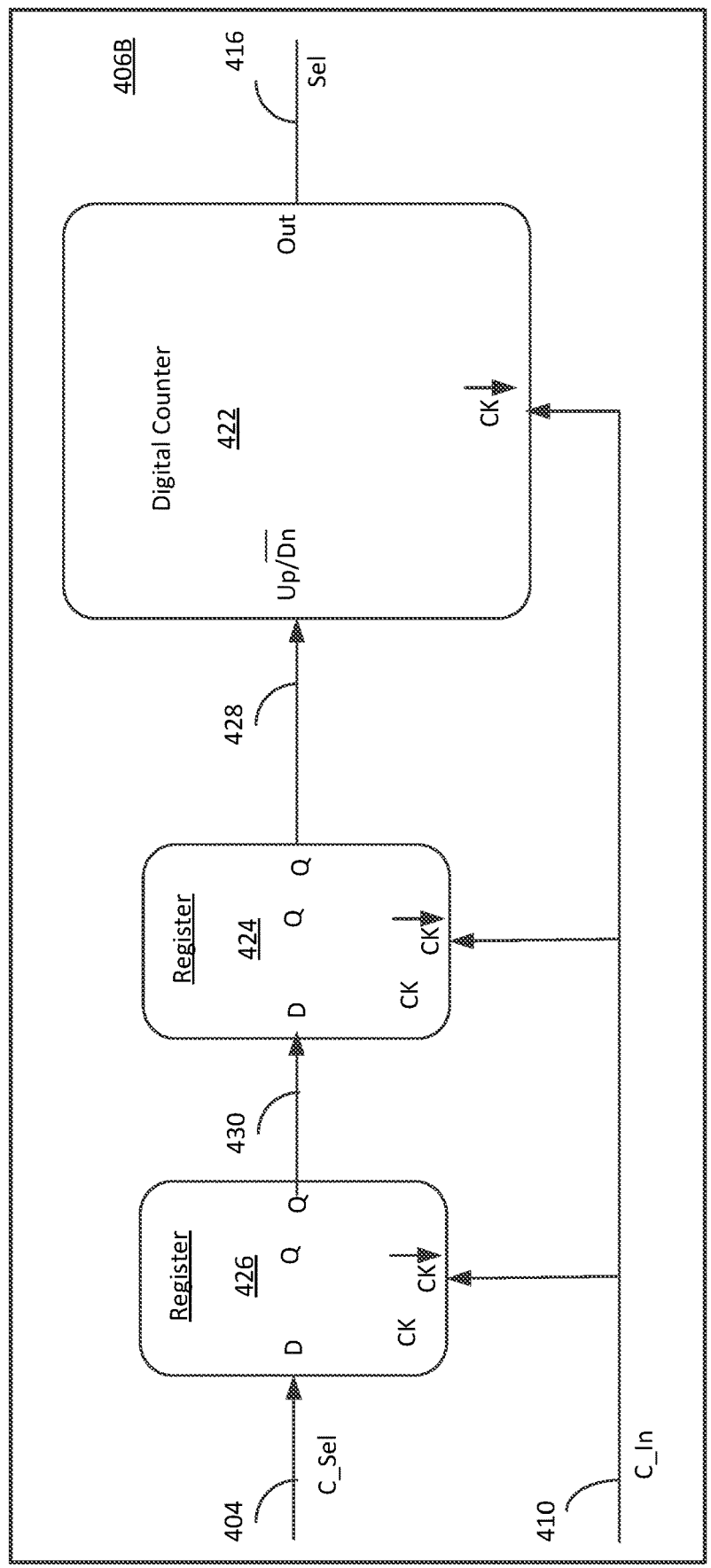
FIG. 4B shows still another exemplary implementation of the feedback circuitry according to certain aspects of the present disclosure.

To further mitigate the uncertainty of the count control input 428, more registers may be added into the signal path from the selected one of the plurality of delayed versions of the input clock C_Sel to the count control input 428. FIG. 4B shows another exemplary implementation 406B of the feedback circuitry 206 for a delay with respect to the input clock C_In that is one-half of clock period of the input clock C_In. In addition to the digital counter 422 and the register 424, the feedback circuitry 206 further comprises another register configured to receive the input clock and the selected one of the plurality of delayed versions of the input clock and to provide a register input data to the register 424. A second register 426 is added in the path from the configuration in FIG. 4A. The second register 426 has an input coupled to the selected one of the plurality of delayed versions of the input clock C_Sel. The second register 426 is clocked and triggered by the falling edge of the input clock C_In. The second register 426 stores the value of the selected one of the plurality of delayed version of the input clock C_Sel at the falling edge of the input clock C_In before it passes the value to the first register 424 at terminal 430.

For the same purposes, with the same concepts, and by a similar approach, one or more registers may be added into the signal paths from the selected one of the plurality of delayed version of the input clock C_Sel to the count control input 304 in the digital counters 322B, 322C, and 322D in the configurations in FIGS. 3B-3D.

The implementation of the feedback circuitry 206 is not limited to the exemplary implementations described above. Other designs that respond to variation and select a delayed version of the input clock having a desired delay may be used. The desired delay is not limited to one-half of clock period or one clock period. Other predetermined delay values may be chosen with appropriate design.

Figure 5:
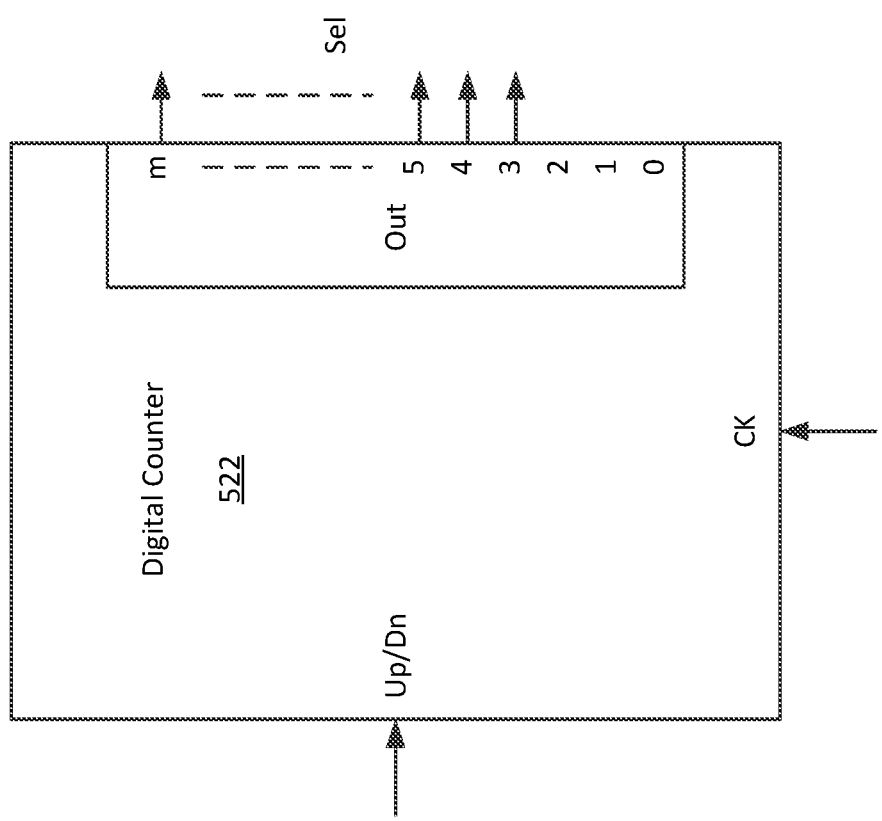
FIG. 5 shows an exemplary digital counter according to certain aspects of the present disclosure.

The digital counters 322A, 322B, 322C, 322D, and 422 may be an up down counter implemented using flip-flops. The output of the digital counter may be multi-bit data. The clock selection signal Sel may comprise all of the multi-bit data from the digital counter, or it may comprises only a subset of the multi-bit data, as illustrated in FIG. 5. In FIG. 5, the clock selection signal Sel uses only the most significant bits of the multi-bit data. One or more least significant bits are not used. The digital counter 522 does not necessarily output the unused least significant bits. It may simply not generate those bits at all. By not using one or more least significant bits, the feedback circuitry 206 need not change the clock selection signal Sel at every rising or falling edge of the input clock C_In. The selected one of the plurality of delayed versions of the input clock C_Sel may then bounce back and forth less frequently.

The multi-bit clock selection signal Sel may be encoded, such as Gray coded, to thereby form multi-bit encoded data. The Gray coded data has the advantage over the binary coded data that only one bit changes for each update. This is useful for circuits that are sensitive to glitches. The encoding may be implemented separately from the digital counter or may be part of the digital counter.

At the quasi-stable state, the clock selection signal Sel, through the selection circuitry 204 selects one of the plurality of delayed version of the input clock C1, C2, C3, . . . , Cn that has the desired delay from the input clock C_In. The value of the clock selection signal Sel indicates which delay unit is generating the desired delay, with each delay unit or series of delay units being capable of individually or jointly generating a delay to offset in time the input clock by a fraction of one clock period of the input clock. In other words, the value of the clock selection signal Sel indicates the number of the delay units needed to generate the desired delay. The clock selection signal Sel, therefore, may be used to pick a delay unit of the delay line 202 that generates other delays that are some fraction of one clock period of the input clock, such as one-quarter, one-third, or one-half of the clock period of the input clock. For example, if the clock selection signal Sel enables the selection circuitry 204 to output a delayed version of the input clock that is generated by the $24^{th}$ delay unit of the delay line 202, and the desired delay is one-half of a clock period of the input clock, then the $12^{th}$ delay unit of the delay line 202 generates a delayed version of the input clock having a delay of about one-quarter of one clock period. A delayed version of the input clock having a delay of about one-third of one clock period would be generated by the $16^{th}$ delay unit of the delay line 202. If the clock selection signal Sel enables the selection circuitry 204 to output a delayed version of the input clock that is generated by the $24^{th}$ delay unit of the delay line 202, and the desired delay is one clock period of the input clock, then the $6^{th}$ delay unit of the delay line 202 generates a delayed version of the input clock having a delay of about one-quarter of one clock period. A delayed version of the input clock having a delay of about one-third of one clock period would be generated by the $8^{th}$ delay unit of the delay line 202. A delayed version of the input clock having a delay of about one-half of one clock period would be generated by the $12^{th}$ delay unit of the delay line 202.

Figure 6:
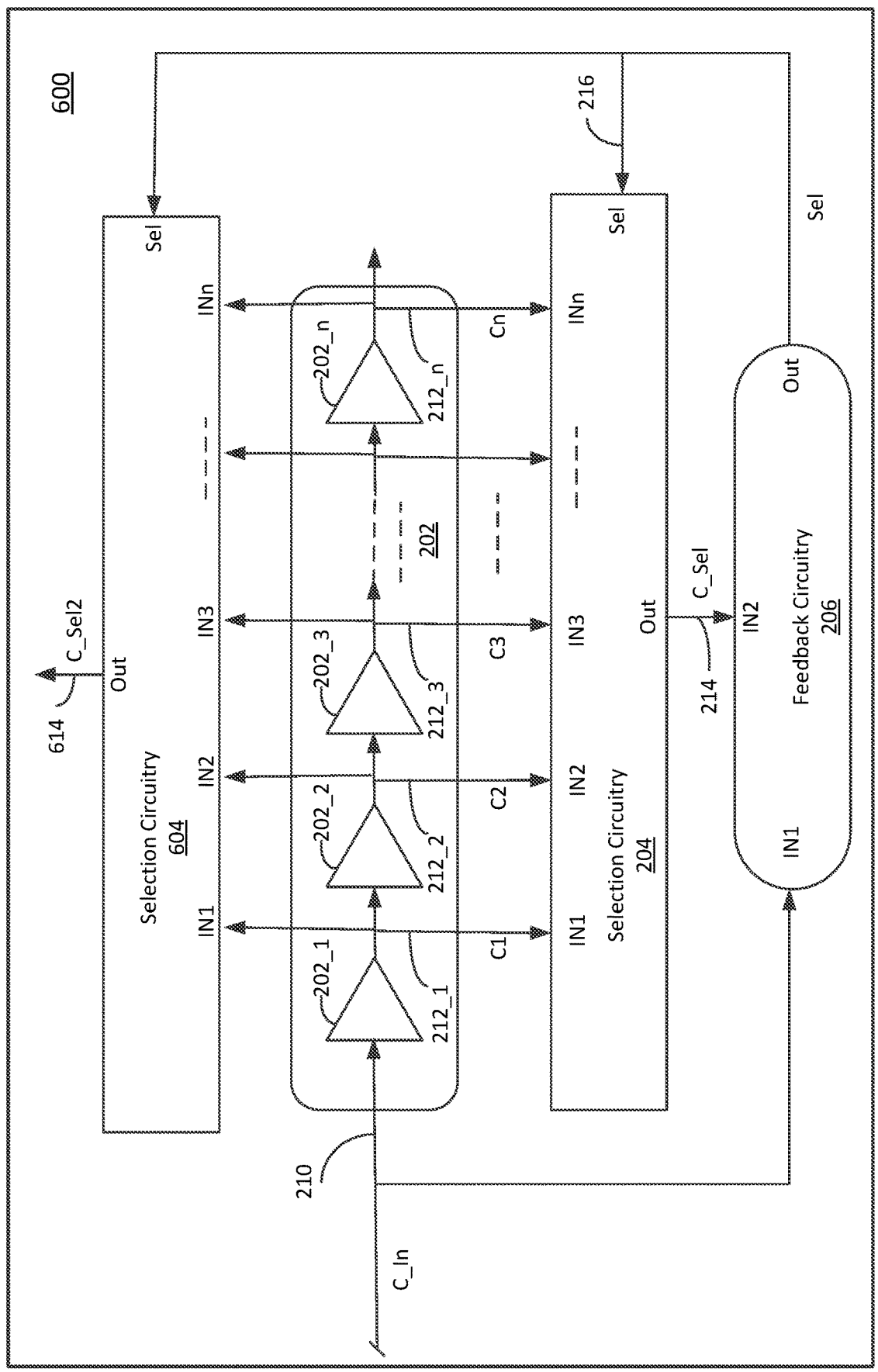
FIG. 6 shows an example of circuitry using the clock selection signal generated by the feedback circuitry to select one or more delayed versions of an input clock according to certain aspects of the present disclosure.

FIG. 6 shows an exemplary use of the clock selection signal Sel to generate other desired delayed clocks. Second selection circuitry 604 receives a set of the plurality of delayed versions of the input clock C1, C2, C3, . . . , Cn and the clock selection signal Sel. The set of the plurality of delayed versions of the input clock may be all of the plurality of delayed versions of the input clock C1, C2, C3, . . . , Cn or a subset of the plurality of delayed versions of the input clock C1, C2, C3, . . . , Cn. The subset may be arbitrarily picked from the plurality of delayed versions of the input clock C1, C2, C3, . . . , Cn. The subset of the plurality of delayed versions of the input clock received by the selection circuitry 604 may be the same as the subset of the plurality of delayed version of the input clock received by the selection circuitry 204, or they may be a different subset. The following illustration uses an example where the selection circuitry 604 receives all of the plurality of delayed versions of the input clock C1, C2, C3, . . . , Cn. The same concept applies to a configuration where fewer than all of the plurality of delayed versions of the input clock C1, C2, C3, . . . , Cn are fed into the selection circuitry 604.

At the output 614, the selection circuitry 604 provides one or more delayed versions of the input clock C_Sel2 selected from the set of the plurality of delayed versions of the input clock C1, C2, C3, . . . , Cn based on the clock selection signal Sel. Like the selection circuitry 204, the selection circuitry 604 may be implemented using a multiple-input one-output multiplexer. The multiple-input one-output multiplexer receives the clock selection signal Sel. The multiplexer comprises the digital logic using the clock selection signal Sel to select a desired delayed version of the input clock C_Sel2 from the set of the plurality of delayed version of the input clock C1, C2, C3, . . . , Cn. As discussed previously, one may derive from the clock selection signal Sel the number of the delay units needed to generate other delays, such as one-quarter, one-third, one-half, or two-thirds of the clock period of the input clock. The selection circuitry 604 outputs the selected delayed version of the input clock C_Sel2 at terminal 614.

If more than one delayed version of the input clock are needed, more than one multiple-input one-output multiplexer may be used, each selecting one out of the set of the plurality of delayed versions of the input clock based on the clock selection signal Sel. Alternatively, a multiple-input multiple-output multiplexer may be used. A person skilled in the art would understand how to design such a digital multiplexer. The methods are not limited to those discussed. Other approaches are possible to selectively output the desired one or more delayed versions of the input clock based on the clock selection signal.

Figure 7:
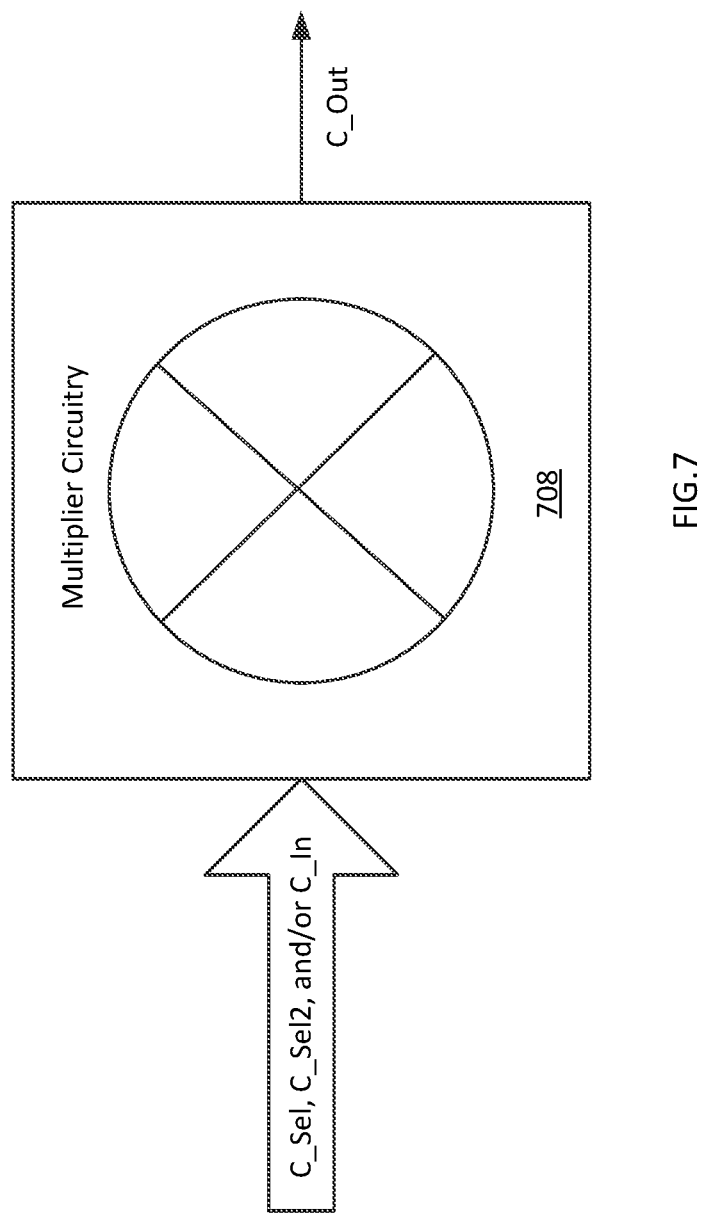
FIG. 7 shows an example of clock multiplier circuitry configured to generate a desired clock using the selected one or more delayed versions of the input clock and the input clock according to certain aspects of the present disclosure.

The delayed versions of the input clock selected by either the selection circuitry 204 (C_Sel) or the selection circuitry 604 (C_Sel2) are subject to relatively small or insignificant variation due to one or a combination of process, voltage, and temperature variation. They may be used to generate other clocks. FIG. 7 illustrates an embodiment to generate a higher frequency clock than the input clock. Clock multiplier circuitry 708 receives one or more selected delayed versions of the input clock C_Sel2, and/or the input clock C_In itself and provides an output clock C_Out having a frequency that is an integer multiple of a frequency of the input clock C_In. The integer multiple may be 1, 2, 3, etc.

Exemplary implementations of the clock multiplier circuitry 708 will now be discussed below with reference to FIGS. 8A-8D.

Figure 8A:
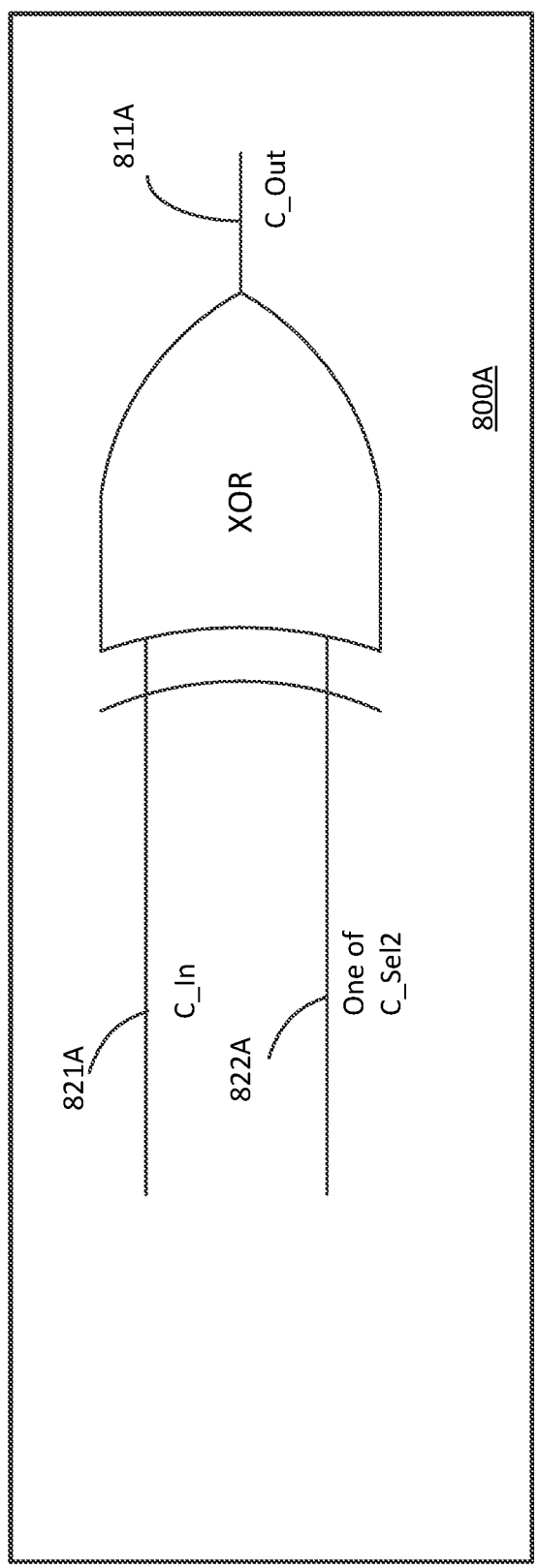
FIG. 8A shows an exemplary implementation of the clock multiplier circuitry according to certain aspects of the present disclosure.

FIG. 8A illustrates generally at 800A use of an XOR gate to generate a clock having a frequency that is twice the frequency of the input clock. The XOR gate receives two inputs: the input clock C_In at 821A and the delayed version of the input clock having a delay with respect to the input clock C_In of about one-quarter of the clock period of the input clock at 822A. The delayed version of the input clock may be one of C_Sel2 generated by the selection circuitry 604. The output clock of the XOR gate C_Out at 811A has a frequency that is twice the frequency of the input clock C_In. The waveforms of the XOR gate are illustrated in FIG. 9A.

Figure 8B:
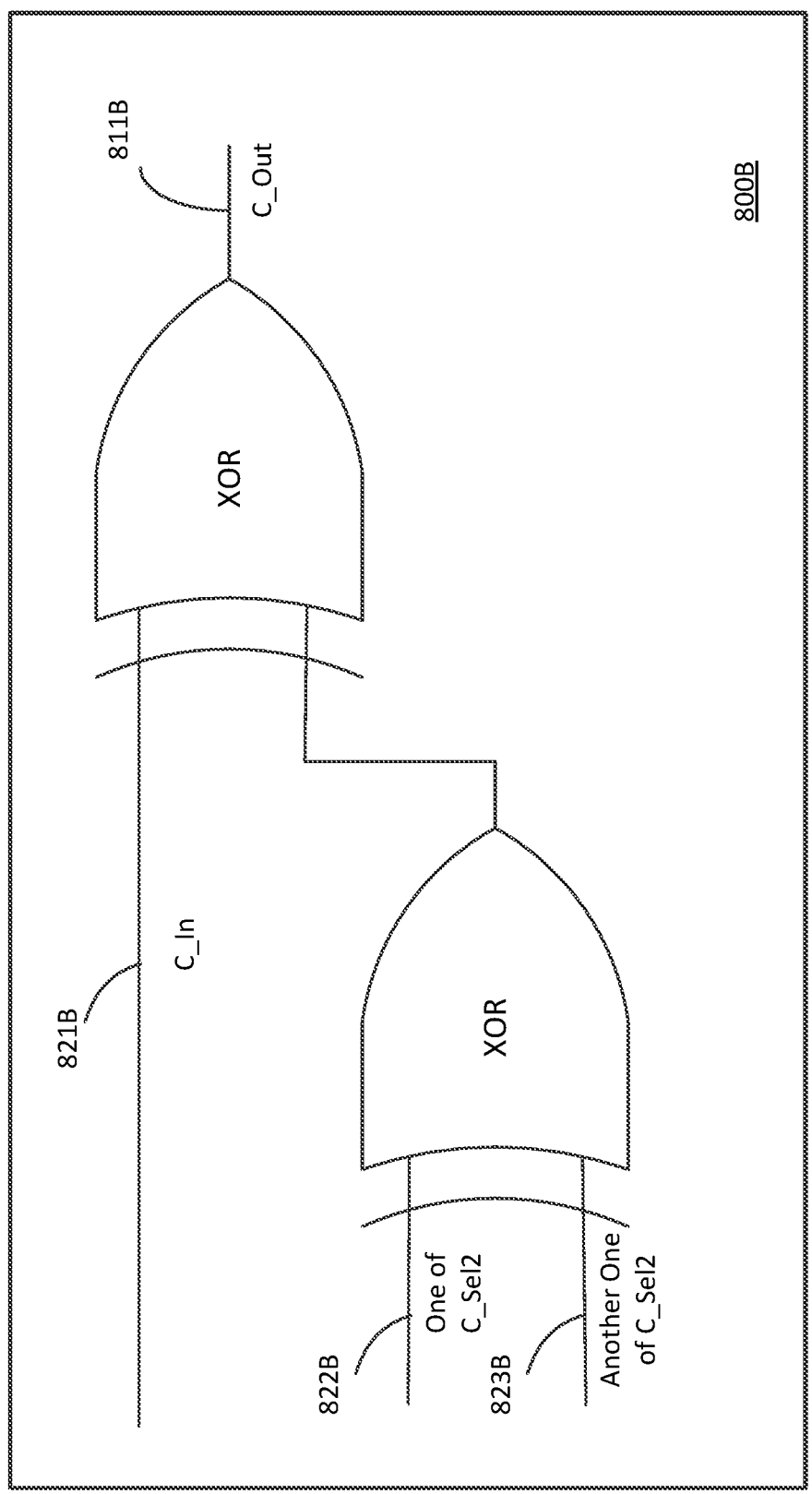
FIG. 8B shows another exemplary implementation of the clock multiplier circuitry according to certain aspects of the present disclosure.

FIG. 8B illustrates generally at 800B another implementation of clock multiplier circuitry 708 using two cascaded XOR gates to generate a clock having a frequency that triples a frequency of the input clock. The XOR gates receive three inputs: the input clock C_In at 821B, a delayed version of the input clock having a delay with respect to the input clock C_In of about one-third of the clock period of the input clock at 822B, and another delayed version of the input clock having a delay with respect to the input clock C_In of about two-thirds of the clock period of the input clock at 823B. Each of the delayed versions of the input clock may be one of C_Sel2 generated by the selection circuitry 604. The output clock of the XOR gates at 811B has a frequency that triples a frequency of the input clock C_In. The waveforms of the XOR gates are illustrated in FIG. 9B.

An alternative may be made to the embodiments discussed above if an even clock duty cycle is important. If the input clock does not have a 50:50 duty cycle, the output clock can be impaired. FIG. 9C illustrates the impact of duty cycle error in generating an output clock having a frequency that is twice that of a frequency of the input clock. If the input clock is 30% high and 70% low, and if the feedback circuitry 206 responds to the falling edge of the input clock for selecting the desired delay of one-half of a clock period, a different delay is created. Specifically, the actual selected delayed version of the input clock will have a delay of about three-tenths of the clock period, rather than one-half of the clock period. As a result, the output clock for the configuration of FIG. 8A will be two shorter high pulses, then a gap, and repeating, as illustrated in FIG. 9C. This is generally undesirable, and in many cases unacceptable.

One example approach to correct some of the duty cycle error is to use a frequency divider. The frequency divider receives a clock with a relatively uneven duty cycle and generates a clock having a frequency that is one-half of the input clock frequency. Unlike the input clock, the output clock of the frequency divider generally has a close to even duty cycle. A person skilled in the art will know that there are multiple ways to implement a frequency divider. One example is to use a simple binary counter clocked by the clock with an uneven duty cycle.

Figure 8C:
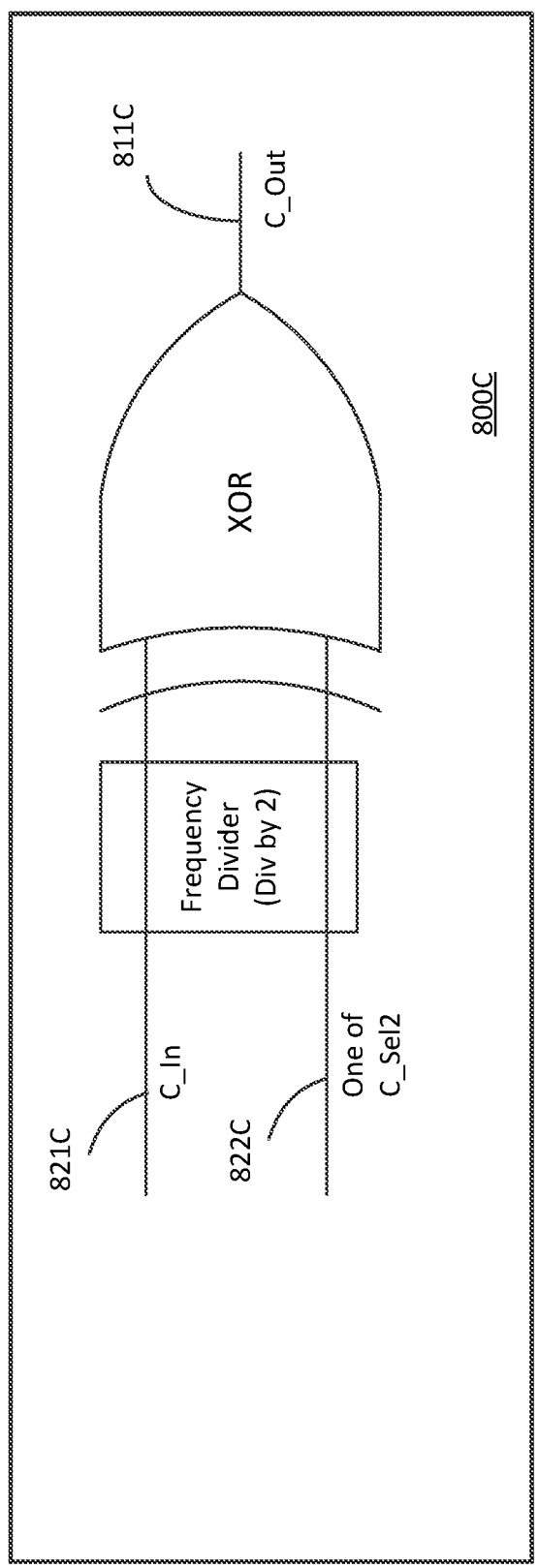
FIG. 8C shows still another exemplary implementation of the clock multiplier circuitry according to certain aspects of the present disclosure.
Figure 8D:
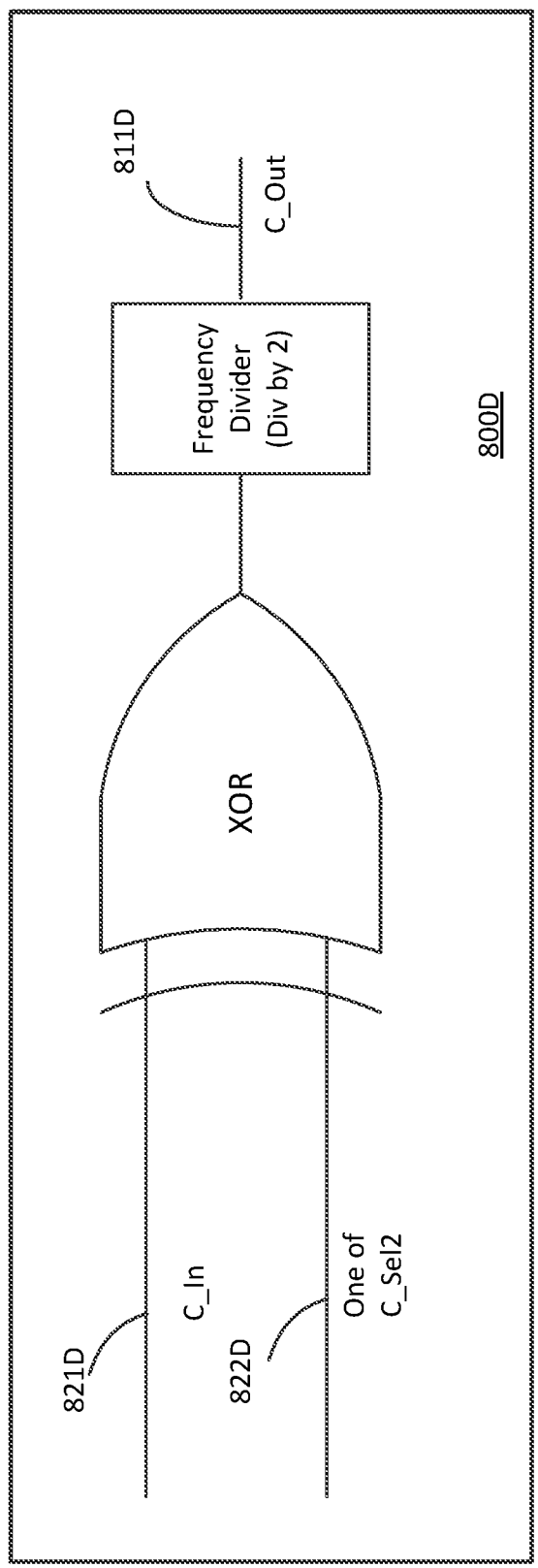
FIG. 8D shows still another exemplary implementation of the clock multiplier circuitry according to certain aspects of the present disclosure

One or more frequency dividers may be added before the node receiving a clock. For example, a frequency divider receives the input clock C_In and generates a close to even duty cycle clock having a frequency that is one-half of the input clock. The output clock of the frequency divider then serves as the new input clock to the circuits in FIGS. 2-8. The frequency dividers may also be added to the inputs of the XOR gates or to the output of the XOR gates, as illustrated in FIG. 8C and FIG. 8D, respectively.

Figure 10:
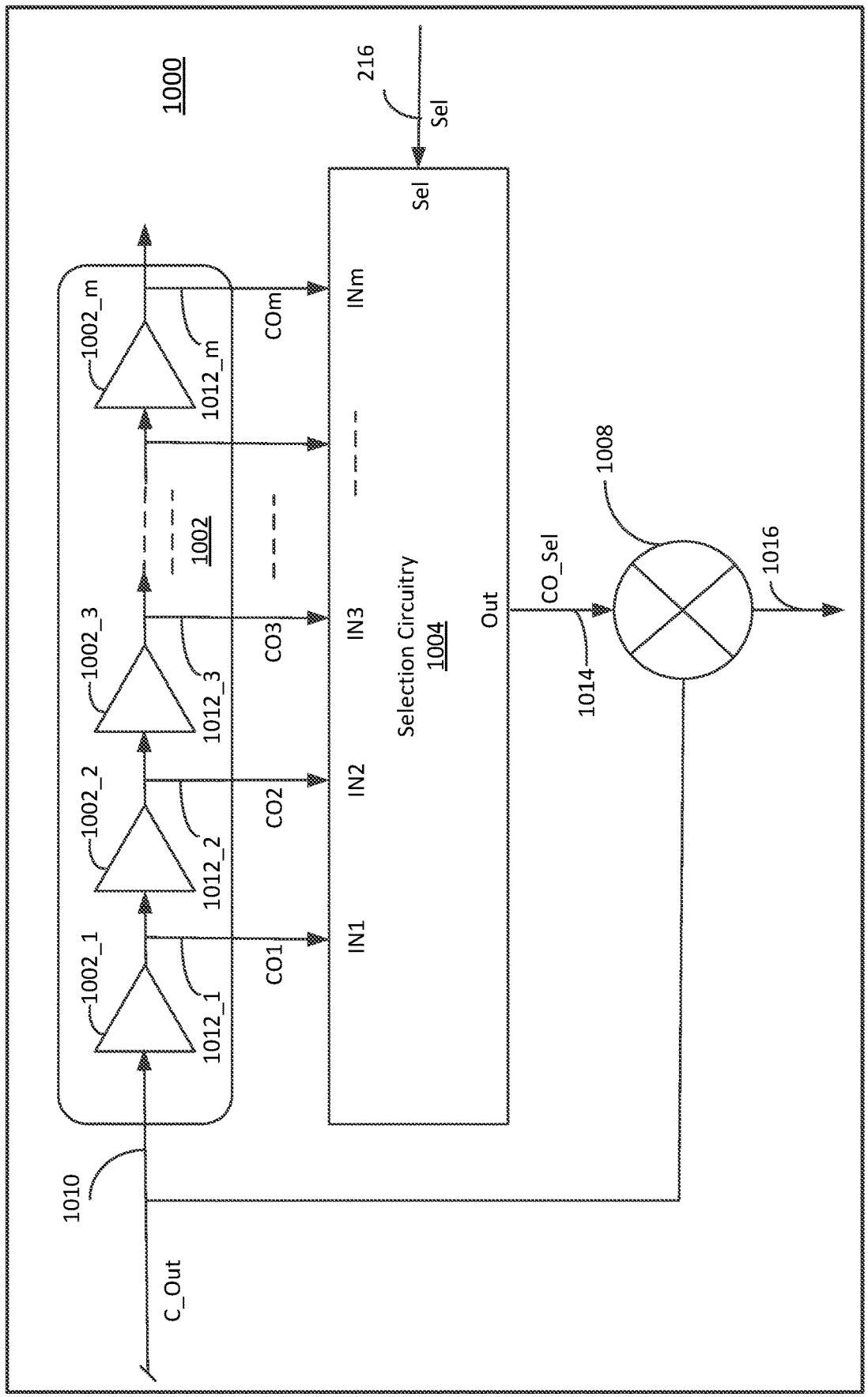
FIG. 10 shows an example of circuitry for generating a clock with a delay line and selection circuitry according to certain aspects of the present disclosure.

The high frequency clock generated by the circuitry illustrated in FIG. 7 may become an input clock to another high frequency clock generation circuitry. FIG. 10 illustrates one such embodiment. Another delay line 1002 is configured to receive the output clock C_Out. The delay line 1002 has a similar configuration as the delay line 202. It comprises a plurality of delay units 1002_1, 1002_2, . . . , 1002_m, where m is an integer and may be the same as or different from n. The delay units 1002_1, 1002_2, . . . , 1002_m are coupled in series, with the output of the previous delay unit feeding into the input of the next delay unit. For example, the output of the delay unit 1002_2 couples to the input of the delay unit 1002_3. The input of the first delay unit 1002_1, however, couples to an output clock C_Out.

The plurality of delay units 1002_1, 1002_2, . . . , 1002_m of the delay line 1002 provide a plurality of delayed versions of the output clock CO1, CO2, . . . , COm. Each of the plurality of delay units 1002_1, 1002_2, . . . , 1002_m is configured to provide a respective one of the plurality of delayed versions of the output clock CO1, CO2, . . . , COm. For example, the delay unit 1002_1 generates the delayed version of the output clock CO1, the delay unit 1002_2 generates the delayed version of the output cock CO2, and the delay unit 1002_m generates the delayed version of the output clock COm. Each of the plurality of delayed versions of the output clock CO1, CO2, . . . , COm is a reproduction of the output clock C_Out with a respective delay.

The delay units 1002_1, 1002_2, . . . , 1002_m can be identical to each other in design and identical to the delay units in the delay line 202 in design. As a result, each delay unit in delay line 1002 has a substantially same base delay Td. Each of the plurality of delayed versions of the output clock CO1, CO2, . . . , COm is delayed by an integer multiple of Td from the output clock C_Out. For example, the delayed version of the output clock CO1 is delayed from the output clock C_Out by Td, the delayed version of the output clock CO2 is delayed from the output clock C_Out by 2Td, and the delayed version of the output clock COm is delayed from the output clock C_Out by mTd. As noted previously, Td for each delay unit may be slightly different due to one or the combination of process, voltage, and temperature variation but should be close enough and substantially the same, as their design are typically substantially identical. Alternatively, the design of some or all of the delay units 1002_1, 1002_2, . . . , 1002_m are different but still with a substantially same delay Td. Alternatively, the delay units 1002_1, 1002_2, . . . , 1002_m may be different in design from the delay units of the delay line 202 but still with a substantially same delay, Td.

Since the delay units of the delay line 1002 are substantially identical to the delay units of the delay line 202, the clock selection signal Sel generated by the selection circuitry 204 and the feedback circuitry 206 may be used to select a number of the delay units needed to delay the output clock C_Out. Therefore, a second group of selection circuitry and feedback circuitry can be omitted while still generating another clock selection signal for the delay line 1002. Instead, a selection circuitry 1004 receives a set of the plurality of delayed versions of the output clock CO1, CO2, . . . , COm and selectively provides selected one or more of the delayed versions of the output clock CO_Sel based on the clock selection signal Sel. Clock multiplier circuitry 1008 receives the one or more selected delayed versions of the output clock CO_Sel and the output clock C_Out and provides at its output 1016 a high frequency clock having a frequency that is an integer multiple of a frequency of the output clock C_Out. The selection circuitry 1004 and the clock multiplier circuitry 1008 may be designed similarly to the selection circuitry 204 and the clock multiplier circuitry 708, respectively, or they may be different.

Figure 11:
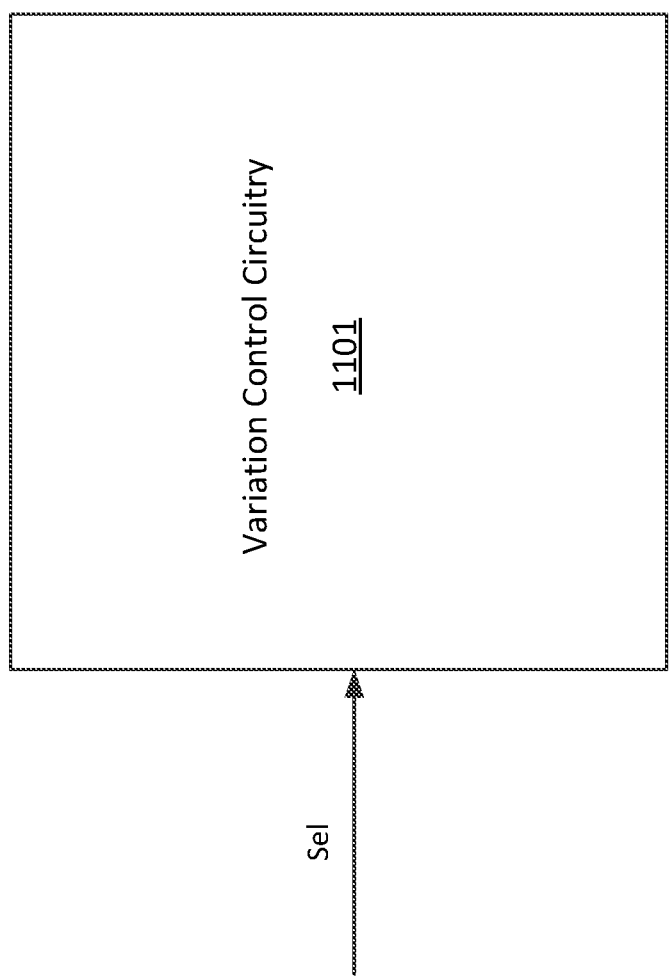
FIG. 11 shows an example of variation control using the clock selection signal generated by the feedback circuitry according to certain aspects of the present disclosure.

The value of the clock selection signal Sel may serve as measurement of the circuit speed or measurement of one or a combination of process, supply voltage, and temperature variation. For example, one may design the circuit in a way that the value of the clock selection signal Sel is a known value for a chip at a nominal process corner. If the value of the clock selection signal Sel in a chip is relatively higher than the known value, it implies each delay unit generates a smaller delay than a delay unit at the nominal process corner does. More delay units are needed to generate the desired delay. The chip is at a fast process corner and runs relatively faster than the chip at the nominal process corner. On the other hand, if the value of the clock selection signal Sel is relatively lower than the known value, it implies each delay unit generates a larger delay than a delay unit at the nominal process corner does. Fewer delay units are needed to generate the desired delay. The chip is at a slow process corner and runs relatively slower than the chip at the nominal process corner. FIG. 11 illustrates another use of the clock selection signal for the voltage and/or the operation clock frequency control. The clock selection signal Sel feeds into variation control circuitry 1101. The variation control circuitry 1101 decodes the clock selection signal Sel to monitor the circuit speed capability or the level of variation or both. Based on the speed capability or the variation level, the variation control circuitry 1101 adjusts the supply voltage or the operation clock frequency or both. The supply voltage or the operation clock frequency to be adjusted may be one of CPU, GPU, memory, PLL, and any other circuit blocks in the same die. For example, if the circuit is at a slow process corner, the variation control circuitry 1101 either increases the supply voltage to raise the speed of the circuit to a desired level or reduces the operation clock frequency to match the circuit speed capability or both. On the other hand, if the circuit is at a fast process corner, the variation control circuitry 1101 either decreases the supply voltage to lower the speed to a desired level or increases the operation clock frequency to match the circuit speed capability or both.

Similar techniques may be used for the temperature variation or the supply voltage variation. A reduction in the supply voltage or the operation clock frequency is effective in reducing a power consumption in a semiconductor integrated circuit. Dynamic voltage or frequency scaling can be used to ensure the circuit functionality and the integrity under varied conditions.

Figure 12:
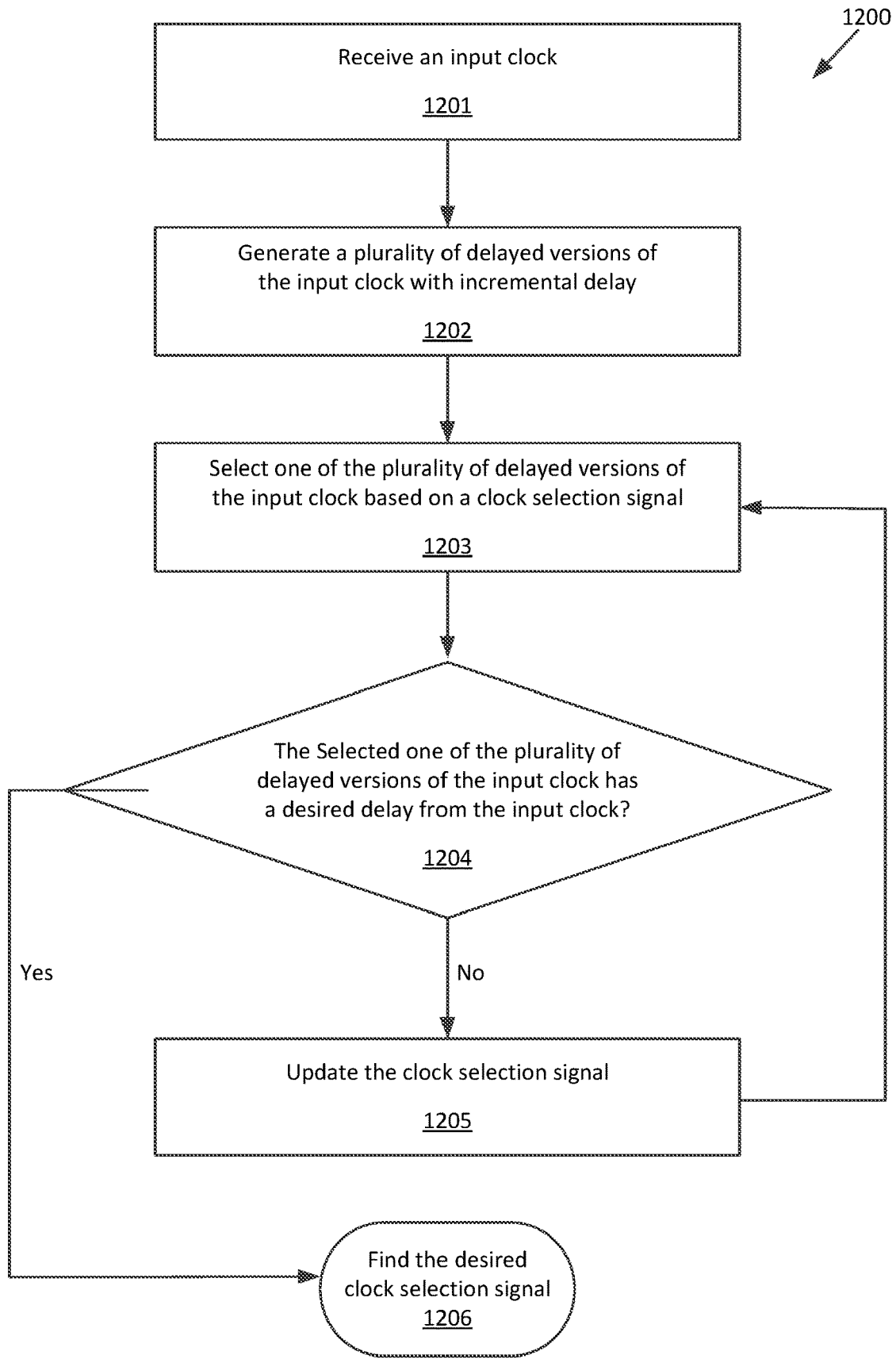
FIG. 12 shows an example method for generating a clock selection signal for selecting a desired delayed clock according to certain aspects of the present disclosure.

FIG. 12 shows a method 1200 for generating a clock selection signal according to certain aspects of the present disclosure. The method 1200 may be performed by the delay line 202, the selection circuitry 204, and the feedback circuitry 206.

At 1201, an input clock is received (e.g., by the clock selection signal generator 200). The input clock can be generated off-chip by a crystal oscillator.

At 1202, a plurality of delayed versions of the input clock are generated (e.g., by the delay line 202). Each of the plurality of delayed versions of the input clock has a different delay relative to each other. Each of the plurality of delayed versions of the input clock has a delay that is about a respective integer multiple of a base delay (e.g., Td).

At 1203, based on the clock selection signal, one of the plurality of delayed versions of the input clock is selected (e.g., by the selection circuitry 204).

At 1204, the selected one of the plurality of delayed versions of the input clock is compared to the input clock (e.g., by the feedback circuitry 206). If the selected one of the plurality of delayed versions of the input clock has a desired delay from the input clock, the method 1200 has found the desired clock selection signal. If the selected one of the plurality of delayed versions of the input clock does not have a desired delay from the input clock, the method continues to 1205.

At 1205, the clock selection signal is updated (e.g., by the feedback circuitry 206). For example, if the selected one of the plurality of delayed versions of the input clock has a delay from the input clock that is smaller than a desired delay, the value of the clock selection signal is increased. If the selected one of the plurality of delayed versions of the input clock has a delay from the input clock that is larger than the desired delay, the value of the clock selection signal is decreased.

After the clock selection signal is updated, the method 1200 goes back to 1203 to select a new delayed version of the input clock (e.g., by the selection circuitry 204). The comparison of the newly selected delayed version of the input clock and the input clock is performed again at 1204 (e.g., by the feedback circuitry 206). These will repeat until the selected one of the plurality of delayed versions of the input clock has a desired delay from the input clock. The method 1200 has then found the desired clock selection signal and concludes at 1206.

Figure 13:
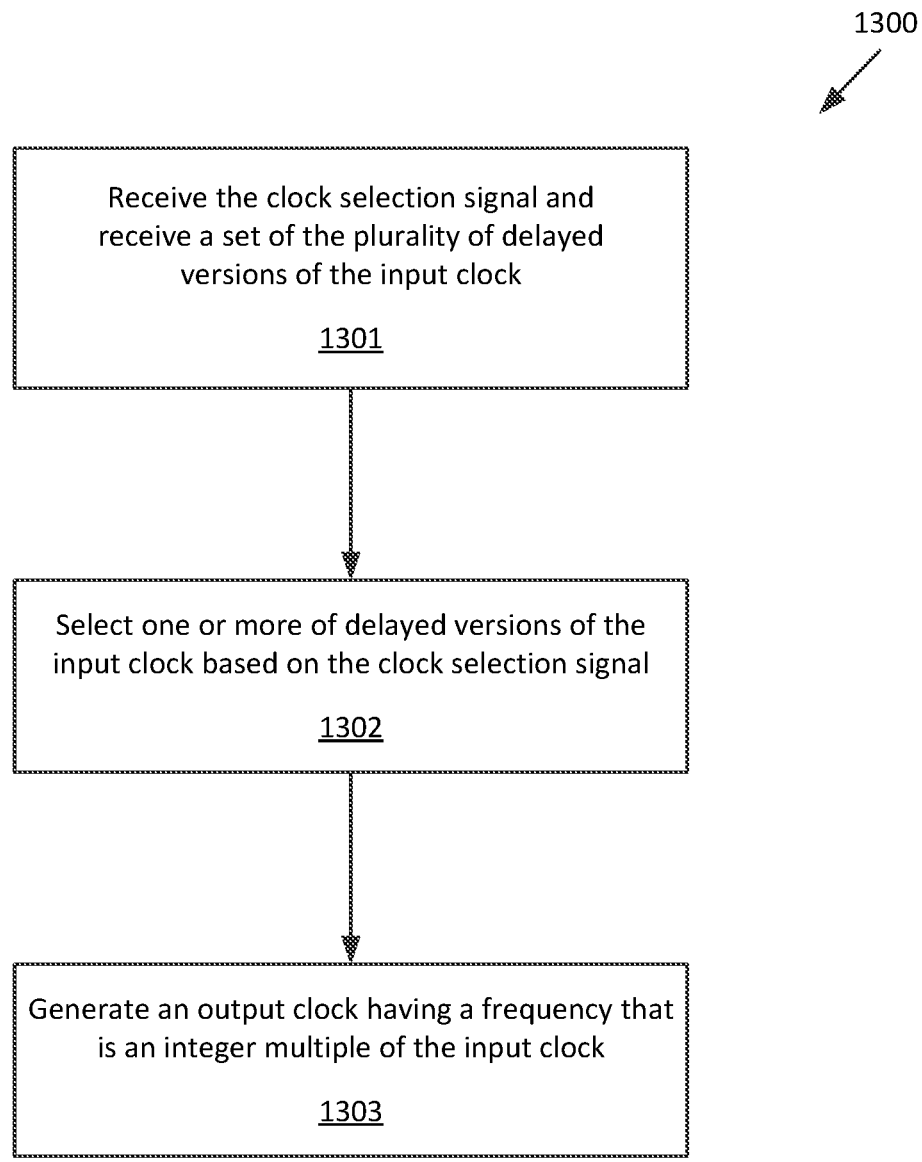
FIG. 13 shows an example method for generating an output clock having a frequency that is an integer multiple of the input clock according to certain aspects of the present disclosure.

FIG. 13 shows a method 1300 for generating an output clock having a frequency that is an integer multiple of the input clock according to certain aspects of the present disclosure. The method 1300 may be performed by the selection circuitry 604 and the clock multiplier circuitry 708.

At 1301, the method 1300 starts (e.g., by the selection circuitry 604 and the clock multiplier circuitry 708) by receiving the clock selection signal and receiving a set of the plurality of delayed versions of the input clock, all generated by the method 1200. At 1302, the method 1300 selects one or more of the plurality of delayed versions of the input clock based on the clock selection signal (e.g., by the selection circuitry 604). The selected one or more of the plurality of delayed versions of the input clock and the input clock feed into a clock multiplier circuitry (e.g., the clock multiplier circuitry 708). At 1303, the clock multiplier circuitry generate an output clock having a frequency that is an integer multiple of the input clock. The integer multiple may be any positive integer, including 1.

Figure 14:
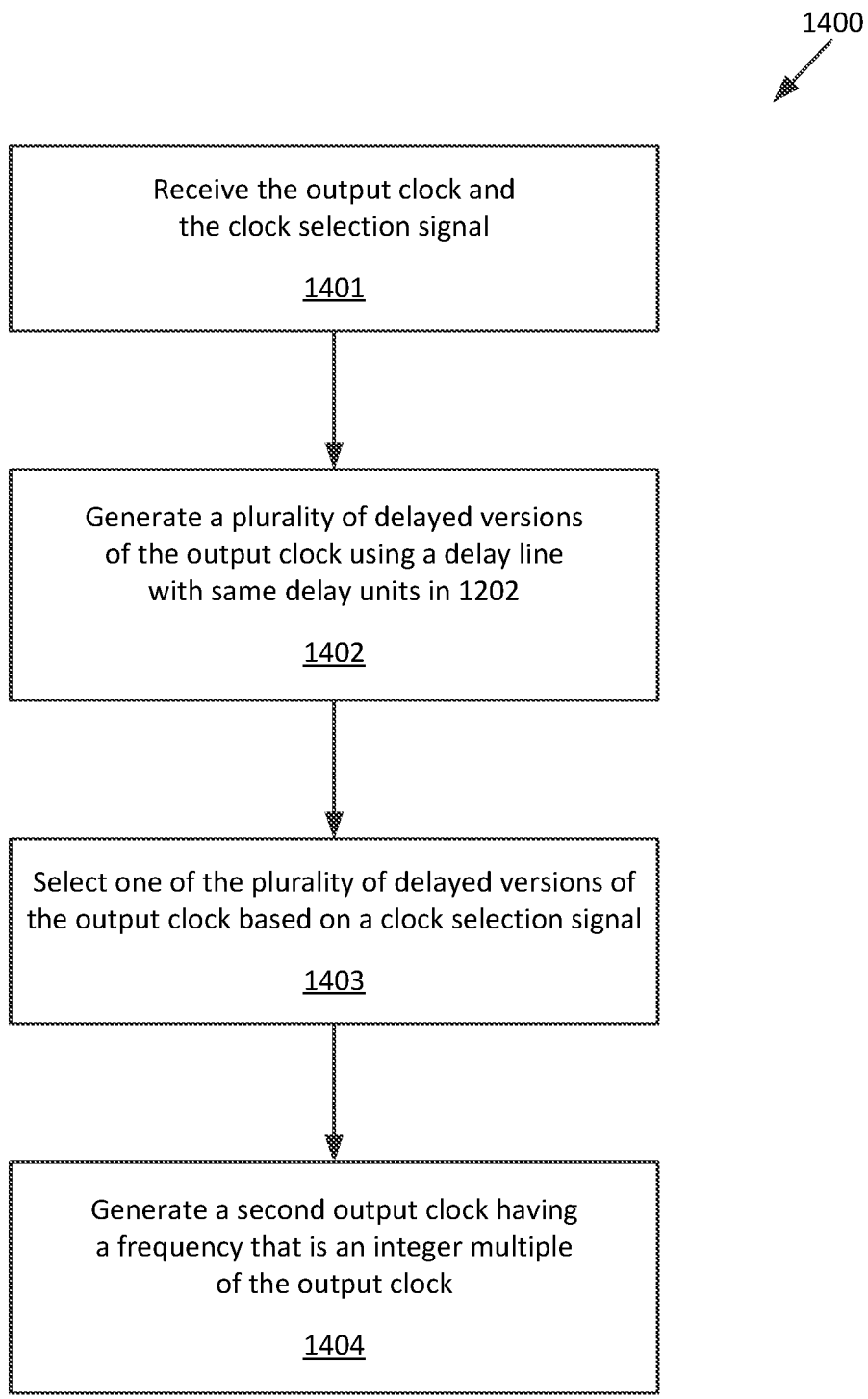
FIG. 14 shows an example method for generating a second output clock having a frequency that is an integer multiple of the output clock according to certain aspects of the present disclosure.

FIG. 14 shows a method 1400 for generating a second output clock having a frequency that is an integer multiple of the output clock generated by the method 1300 according to certain aspects of the present disclosure. The method 1400 may be performed by the delay line 1002, the selection circuitry 1004, and the clock multiplier circuitry 1008.

At 1401, the method 1400 receives (e.g., by the delay line 1002) the output clock generated by the method 1300 and the clock selection signal generated by the method 1200.

At 1402, a plurality of delayed versions of the output clock are generated (e.g., by the delay line 1002). Each of the plurality of delayed versions of the output clock has a different delay relative to each other. Each of the plurality of delayed versions of the output clock has a delay that is about a respective integer of a base delay (e.g., Td). For example, the base delay here is substantially the same as the base delay in the method 1200.

At 1403, one or more of the plurality of delayed versions of the output clock is selected based on the clock selection signal (e.g., by the selection circuitry 1004).

The selected one or more of the plurality of delayed versions of the output clock and the output clock feed into a clock multiplier circuitry (e.g., the clock multiplier circuitry 1008). At 1404, the clock multiplier circuitry generates a second output clock having a frequency that is an integer multiple of the output clock. The integer multiple may be any positive integer, including 1.

Figure 15:
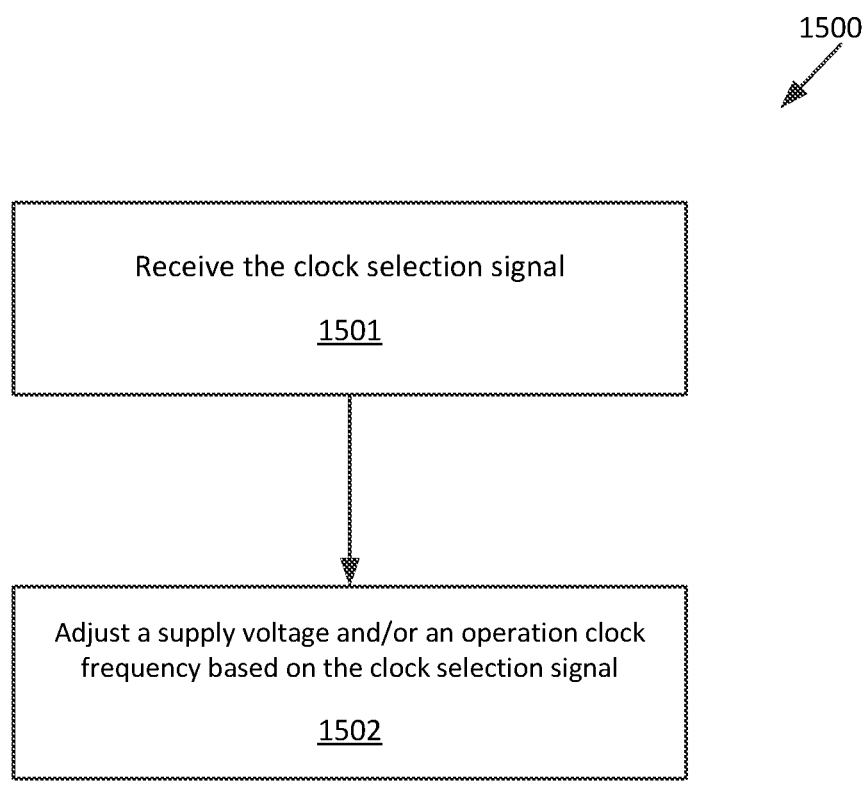
FIG. 15 shows an example method of adjusting a voltage and/or an operation clock frequency using the clock selection signal generated by the feedback circuitry according to certain aspect of the present disclosure.

FIG. 15 shows a method 1500 of using the clock selection signal generated in the method 1200 for process, voltage, and/or temperature variation control according to certain aspects of the present disclosure. The method 1500 may be performed by the variation control circuitry 1101. The method 1500 receives the clock selection signal (e.g., by variation control circuitry 1101). The clock selection signal serves as measurement of the circuit speed or a variation due to one or a combination of the process, supply voltage, and temperature variation. A process, supply voltage, and/or temperature variation monitoring circuitry (e.g., variation control circuitry 1101) can use this information to tune the supply voltage and/or the operation clock frequency to mitigate the variation, as done at 1502.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:
1. A digital circuit, comprising:
a first delay line configured to receive an input clock, the first delay line comprising a plurality of first delay units coupled in series, each of the plurality of first delay units being configured to provide substantially a same first delay, and the plurality of first delay units being configured to provide a plurality of delayed versions of the input clock with each of the plurality of first delay units being configured to provide a respective one of the plurality of delayed versions of the input clock;

first selection circuitry configured to receive a first set of the plurality of delayed versions of the input clock and to provide first selected one of the plurality of delayed versions of the input clock based on a clock selection signal;

feedback circuitry configured to receive the input clock without being delayed by the first delay line, the feedback circuitry comprising a digital counter configured to generate the clock selection signal based on a count control signal and the input clock that is not delayed by the first delay line, the count control signal comprising the first selected one of the plurality of delayed versions of the input clock, the digital counter configured to increment multi-bit data in response to the count control signal having a first logical value and to decrement the multi-bit data in response to the count control signal having a second logical value, the first logical value being different from the second logical value;

second selection circuitry configured to receive a second set of the plurality of delayed versions of the input clock and to provide second selected one or more of the plurality of delayed versions of the input clock based on the clock selection signal; and clock multiplier circuitry configured to receive the input clock and at least one of the second selected one or more of the plurality of delayed versions of the input clock and to provide a first output clock with a frequency that is a first integer multiple of a frequency of the input clock.

2. The digital circuit of claim 1, wherein the first selected one of the plurality of delayed versions of the input clock is offset in time from the input clock by a first fraction of one clock period of the input clock.

3. The digital circuit of claim 1, wherein the feedback circuitry further comprises a first register configured to provide the count control signal in response to the input clock and the first selected one of the plurality of delayed versions of the input clock.

4. The digital circuit of claim 1, wherein the digital counter comprises a single input that is configured to accept the multi-bit data and to select between incrementing and decrementing of the multi-bit data.

5. The digital circuit of claim 1, wherein the clock multiplier circuitry comprises a first XOR gate and a second XOR gate, the first XOR gate configured to receive at least two of the second selected one or more of the plurality of delayed versions of the input clock, the second XOR gate configured to receive the input clock and an output of the first XOR gate.

6. The digital circuit of claim 1, wherein the multi-bit data comprises multi-bit encoded data, and the clock selection signal comprises the multi-bit encoded data and the feedback circuitry is configured to change the multi-bit encoded data in response to a rising or a falling edge of the input clock and the first selected one of the plurality of delayed versions of the input clock.

7. The digital circuit of claim 1, wherein at least one of the second selected one or more of the plurality of delayed versions of the input clock is offset in time from the input clock by a second fraction of one clock period of the input clock.

8. The digital circuit of claim 7, wherein the second fraction is one of one-quarter, one-third, one-half, or two-thirds.

9. The digital circuit of claim 1, wherein the first delay line and the feedback circuitry are configured to receive the input clock via a common node.

10. The digital circuit of claim 1, wherein the clock multiplier circuitry comprises one or more XOR gates.

11. The digital circuit of claim 1, wherein the clock multiplier circuitry comprises frequency divider circuitry configured to receive the input clock and at least one of the second selected one or more of the plurality of delayed versions of the input clock and to provide one or more divided clocks having frequencies that are about one-half of respective frequencies of the input clock and the at least one of the second selected one or more of the plurality of delayed versions of the input clock.

12. The digital circuit of claim 1 further comprising:
a second delay line configured to receive the first output clock, the second delay line comprising a plurality of second delay units coupled in series, each of the plurality of second delay units being configured to provide substantially a same second delay, and the plurality of second delay units being configured to provide a plurality of delayed versions of the first output clock with each of the plurality of second delay units being configured to provide a respective one of the plurality of delayed versions of the first output clock;
third selection circuitry configured to receive a set of the plurality of delayed versions of the first output clock and to provide a selected one or more of the plurality of delayed versions of the first output clock based on the clock selection signal; and
second clock multiplier circuitry configured to receive the first output clock and at least one of the selected one or more of the plurality of delayed versions of the first output clock and to provide a second output clock having a frequency that is a second integer multiple of the frequency of the input clock.

13. The digital circuit of claim 1 further comprising variation control circuitry configured to adjust a supply voltage or an operation clock frequency or both based on the clock selection signal.

14. A method for clock generation, comprising:
receiving an input clock;
generating a plurality of delayed versions of the input clock using a first delay line, the first delay line comprising a plurality of first delay units coupled in series, each of the plurality of first delay units being configured to provide substantially a same first delay, and the plurality of first delay units being configured to provide a plurality of delayed versions of the input clock with each of the plurality of first delay units being configured to provide a respective one of the plurality of delayed versions of the input clock;
selecting first selected one of the plurality of delayed versions of the input clock out of a first set of the plurality of delayed versions of the input clock based on a clock selection signal;
generating the clock selection signal based on the first selected one of the plurality of delayed versions of the input clock and based on the input clock that is not delayed by the first delay line, comprising:
digitally counting to generate the clock selection signal based on a count control signal and the input clock, the count control signal comprising the first selected one of the plurality of delayed versions of the input clock, comprising:

incrementing a digital count data in response to a first logical value of the count control signal and decrementing the digital count data in response to a second logical value of the count control signal, the first logical value being different from the second logical value;

selecting second selected one or more of the plurality of delayed versions of the input clock out of a second set of the plurality of delayed versions of the input clock based on the clock selection signal;

receiving the input clock and at least one of the second selected one or more of the plurality of delayed versions of the input clock; and providing a first output clock having a frequency that is a first integer multiple of a frequency of the input clock.

15. The method of claim 14, wherein the first selected one of the plurality of delayed versions of the input clock is offset in time from the input clock by a first fraction of one clock period of the input clock.

16. The method of claim 14, wherein the providing the first output clock comprises performing a first logical operation based on at least two of the second selected one or more of the plurality of delayed versions of the input clock; and performing a second logical operation based on the input clock and the first logical operation.

17. The method of claim 14, wherein the clock selection signal comprises multi-bit encoded data, and wherein digitally counting to generate the clock selection signal comprises changing the multi-bit encoded data in response to a rising or a falling edge of the input clock and the first selected one of the plurality of delayed versions of the input clock.

18. The method of claim 14, wherein generating the clock selection signal comprises generating the clock selection signal based on a same input clock that is used by the first delay line to generate the plurality of delayed versions of the input clock.

19. The method of claim 14, wherein providing the first output clock comprises generating one or more divided clocks having frequencies that are about one-half of respective frequencies of the input clock and at least one of the second selected one or more of the plurality of delayed versions of the input clock.

20. The method of claim 14 further comprising:

generating a plurality of delayed versions of the first output clock using a second delay line, the second delay line comprising a plurality of second delay units coupled in series, each of the plurality of second delay units being configured to provide substantially a same second delay, and the plurality of second delay units being configured to provide a plurality of delayed versions of the first output clock with each of the plurality of second delay units being configured to provide a respective one of the plurality of delayed versions of the first output clock;

selecting a selected one or more of the plurality of delayed versions of the first output clock out of a set of the plurality of delayed versions of the first output clock based on the clock selection signal; and providing a second output clock having a frequency that is a second integer multiple of the frequency of the input clock using the first output clock and at least one of the selected one or more of the plurality of delayed versions of the first output clock.

21. The method of claim 14 further comprising adjusting a supply voltage or an operation clock frequency or both based on the clock selection signal.

22. A digital circuit, comprising:

a first delay line configured to receive an input clock, the first delay line comprising a plurality of first delay units coupled in series, each of the plurality of first delay units being configured to provide substantially a same first delay, and the plurality of first delay units being configured to provide a plurality of delayed versions of the input clock with each of the plurality of first delay units being configured to provide a respective one of the plurality of delayed versions of the input clock;

means for selecting first selected one of the plurality of delayed versions of the input clock out of a first set of the plurality of delayed versions of the input clock based on a clock selection signal;

means for generating the clock selection signal based on the first selected one of the plurality of delayed versions of the input clock and based on the input clock that is not delayed by the first delay line, the means for generating comprising means for digitally counting to generate the clock selection signal based on a count control signal and the input clock, the count control signal comprising the first selected one of the plurality of delayed versions of the input clock, the means for digitally counting to generate the clock selection signal comprising means for incrementing a digital count data in response to a first logical value of the count control signal and decrementing the digital count data in response to a second logical value of the count control signal, the first logical value being different from the second logical value;

means for selecting second selected one or more of the plurality of delayed versions of the input clock out of a second set of the plurality of delayed versions of the input clock based on the clock selection signal; and means for providing a first output clock having a frequency that is a first integer multiple of a frequency of the input clock.

23. The digital circuit of claim 22, wherein the first selected one of the plurality of delayed versions of the input clock is offset in time from the input clock by a fraction of one clock period of the input clock.

24. The digital circuit of claim 22, wherein the means for providing a first output clock comprises a first XOR gate and a second XOR gate, the first XOR gate configured to receive at least two of the second selected one or more of the plurality of delayed versions of the input clock, the second XOR gate configured to receive the input clock and an output of the first XOR gate.

25. The digital circuit of claim 22, wherein at least one of the second selected one or more of the plurality of delayed versions of the input clock is offset in time from the input clock by a fraction of one clock period of the input clock.

26. The digital circuit of claim 22, wherein the input clock received by the first delay line and the input clock used by the means for generating the clock selection signal is a same input clock.

27. The digital circuit of claim 22 further comprising:

a second delay line configured to receive the first output clock, the second delay line comprising a plurality of second delay units coupled in series, each of the plurality of second delay units being configured to provide substantially a same second delay, and the plurality of second delay units being configured to provide a plurality of delayed versions of the first output clock with each of the plurality of second delay units being configured to provide a respective one of the plurality of delayed versions of the first output clock;

means for selecting a selected one or more of the plurality of delayed versions of the first output clock out of a set of the plurality of delayed versions of the first output clock based on the clock selection signal; and means for providing a second output clock having a frequency that is a second integer multiple of the frequency of the input clock using the first output clock and at least one of the selected one or more of the plurality of delayed versions of the first output clock.

28. The digital circuit of claim 22 further comprising means for adjusting a supply voltage or an operation clock frequency or both based on the clock selection signal.

* * * * *